(12) United States Patent
Wu et al.

(10) Patent No.: US 11,295,973 B2
(45) Date of Patent: Apr. 5, 2022

(54) APPARATUS AND METHOD FOR AUTOMATED WAFER CARRIER HANDLING

(71) Applicant: Taiwan Semiconductor Manufacturing Co., Ltd., Hsinchu (TW)

(72) Inventors: Ren-Hau Wu, New Taipei (TW); Cheng-Lung Wu, Hsinchu (TW); Jiun-Rong Pai, Hsinchu County (TW); Cheng-Kang Hu, Kaohsiung (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 153 days.

(21) Appl. No.: 16/787,028

(22) Filed: Feb. 11, 2020

(65) Prior Publication Data
US 2021/0249282 A1 Aug. 12, 2021

(51) Int. Cl.
*H01L 21/677* (2006.01)
*H01L 21/67* (2006.01)

(52) U.S. Cl.
CPC .... *H01L 21/6773* (2013.01); *H01L 21/67259* (2013.01); *H01L 21/67715* (2013.01); *H01L 21/67733* (2013.01); *H01L 21/67736* (2013.01)

(58) Field of Classification Search
CPC ........... H01L 21/6773; H01L 21/67379; H01L 21/67733; H01L 21/67259; H01L 21/67715; H01L 21/67736; H01L 21/68707; H01L 21/67766; H01L 21/67775
See application file for complete search history.

(56) References Cited

U.S. PATENT DOCUMENTS

| 9,011,068 | B2 * | 4/2015 | Inui | H01L 21/67769 |
| | | | | 414/267 |
| 9,543,178 | B2 * | 1/2017 | Lee | H01L 21/67733 |
| 2003/0017420 | A1 * | 1/2003 | Mahorowala | H01L 21/0276 |
| | | | | 430/313 |
| 2006/0051188 | A1 * | 3/2006 | Hoshino | H01L 21/67736 |
| | | | | 414/277 |

(Continued)

FOREIGN PATENT DOCUMENTS

| CN | 108987318 | 12/2018 |
| CN | 109979845 | 7/2019 |

(Continued)

OTHER PUBLICATIONS

"Office Action of Taiwan Counterpart Application", dated Apr. 30, 2021, pp. 1-5.

*Primary Examiner* — Jarrett J Stark
(74) *Attorney, Agent, or Firm* — JCIPRNET

(57) ABSTRACT

An apparatus and an operating method for automated wafer carrier handling are provided. The apparatus includes a base frame and an engaging mechanism disposed on the base frame. The engaging mechanism includes a controller and an active expansion component moveably coupled to the base frame and controlled by the controller to perform a reciprocating movement relative to the base frame. The active expansion component is driven by the controller to pass through the base frame to be engaged with a top flange mounted on the wafer carrier.

20 Claims, 25 Drawing Sheets

(56) References Cited

U.S. PATENT DOCUMENTS

| | | | | |
|---|---|---|---|---|
| 2006/0051192 A1* | 3/2006 | Fujiki | B65G 47/5104 | |
| | | | | 414/626 |
| 2007/0009345 A1* | 1/2007 | Hall | H01L 21/67772 | |
| | | | | 414/222.01 |
| 2010/0176151 A1* | 7/2010 | Johnson | B65D 77/067 | |
| | | | | 222/92 |
| 2011/0031091 A1* | 2/2011 | Fatula, Jr | B66C 11/06 | |
| | | | | 198/463.3 |
| 2011/0297771 A1* | 12/2011 | Noda | H01L 21/6836 | |
| | | | | 241/65 |
| 2013/0084459 A1* | 4/2013 | Larson | C09D 133/16 | |
| | | | | 428/422 |
| 2015/0031215 A1* | 1/2015 | Mahoney | H01L 21/6836 | |
| | | | | 438/759 |
| 2015/0197400 A1* | 7/2015 | Kinugawa | H01L 21/67736 | |
| | | | | 414/458 |
| 2015/0214084 A1* | 7/2015 | Schneider | H01L 21/67389 | |
| | | | | 206/711 |
| 2016/0341256 A1* | 11/2016 | Huang | F16D 7/048 | |
| 2019/0382206 A1* | 12/2019 | Kinugawa | H01L 21/67706 | |
| 2020/0013652 A1* | 1/2020 | Kobayashi | B66C 13/18 | |
| 2020/0070360 A1* | 3/2020 | Glatz | B25J 5/007 | |
| 2021/0170584 A1* | 6/2021 | Kopec | B25J 9/1656 | |
| 2021/0249282 A1* | 8/2021 | Wu | H01L 21/6773 | |
| 2021/0296149 A1* | 9/2021 | Green | H01L 21/67383 | |

FOREIGN PATENT DOCUMENTS

| | | |
|---|---|---|
| TW | 200704573 | 2/2007 |
| TW | 201531432 | 8/2015 |
| TW | M578219 | 5/2019 |

\* cited by examiner

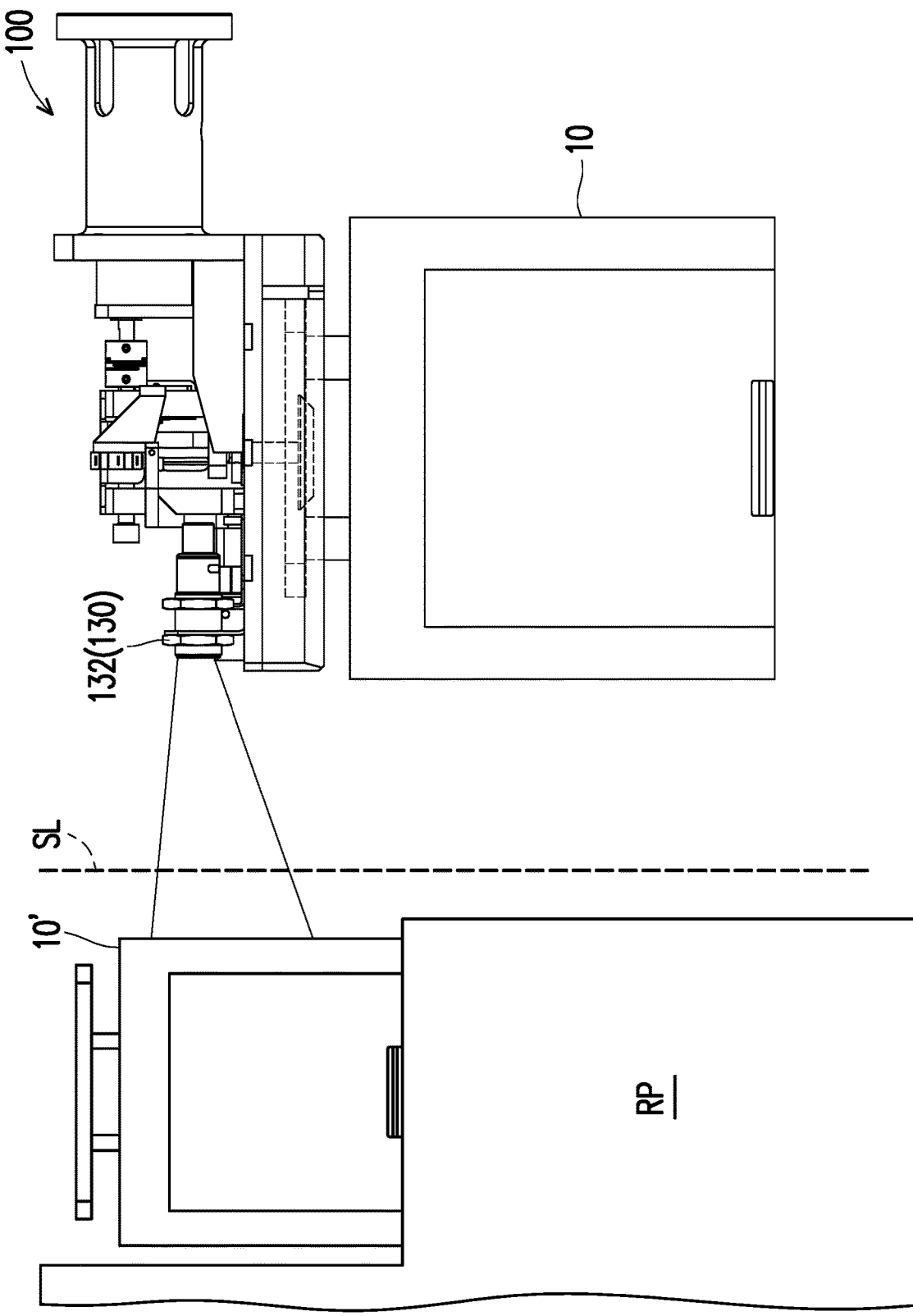

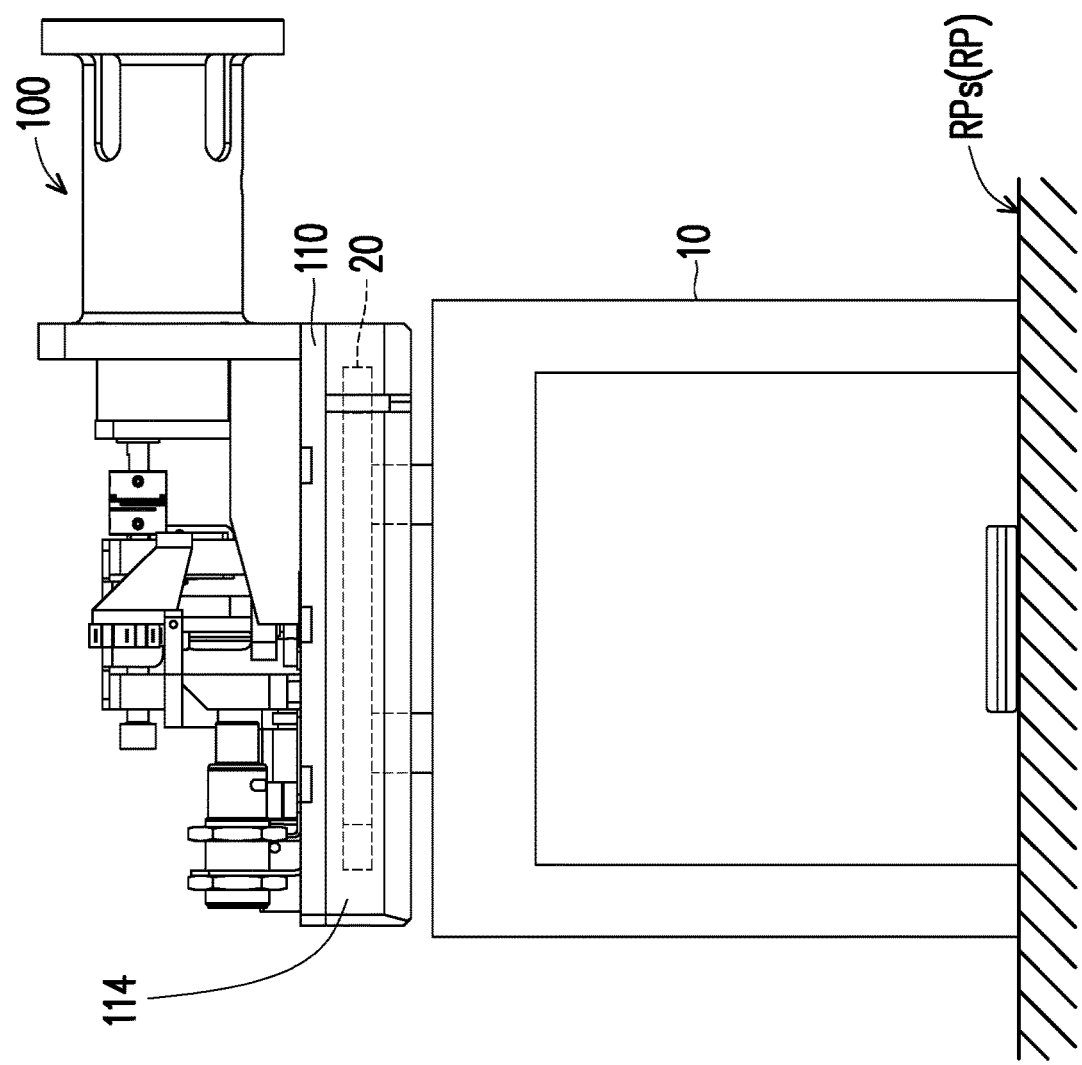

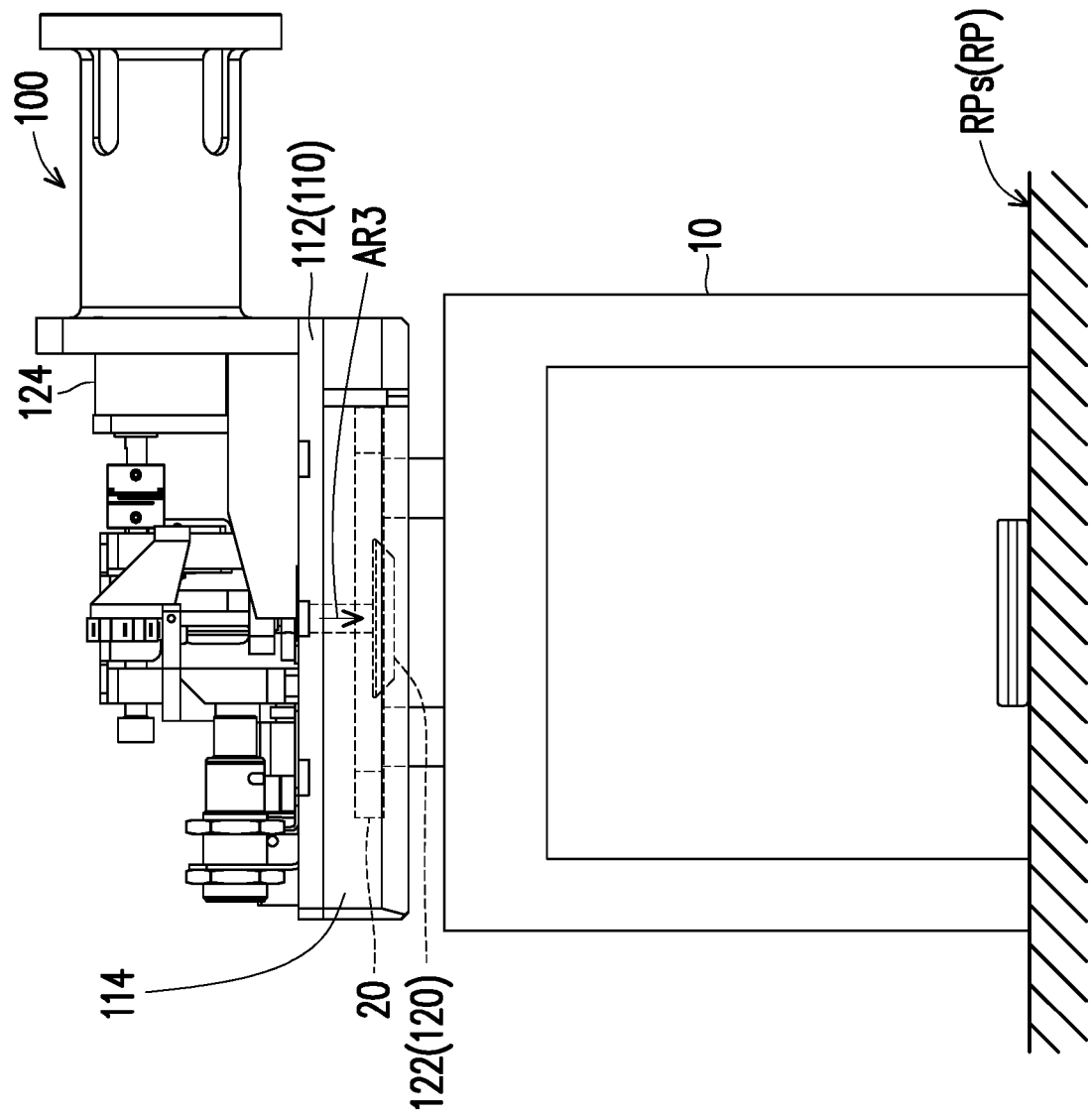

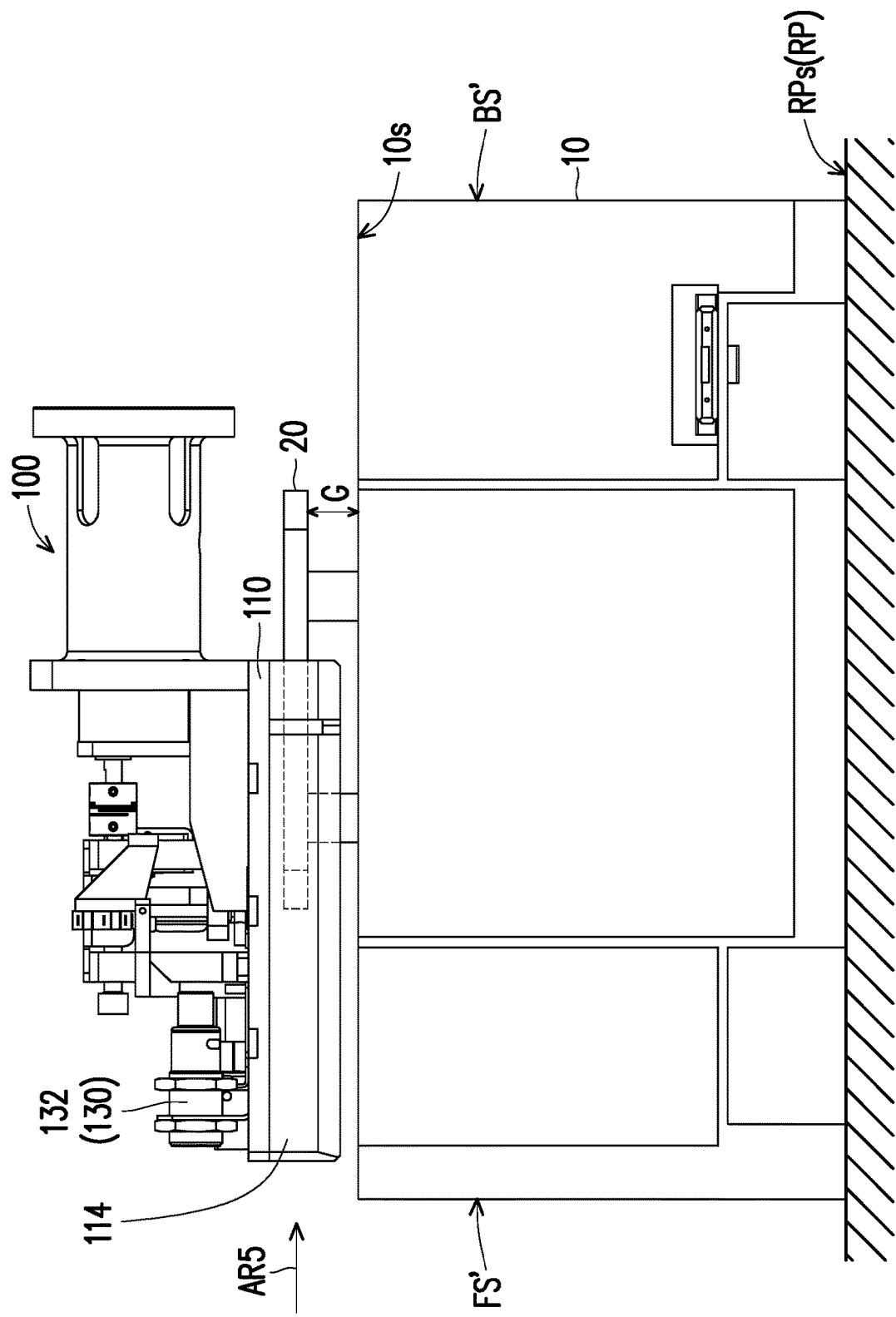

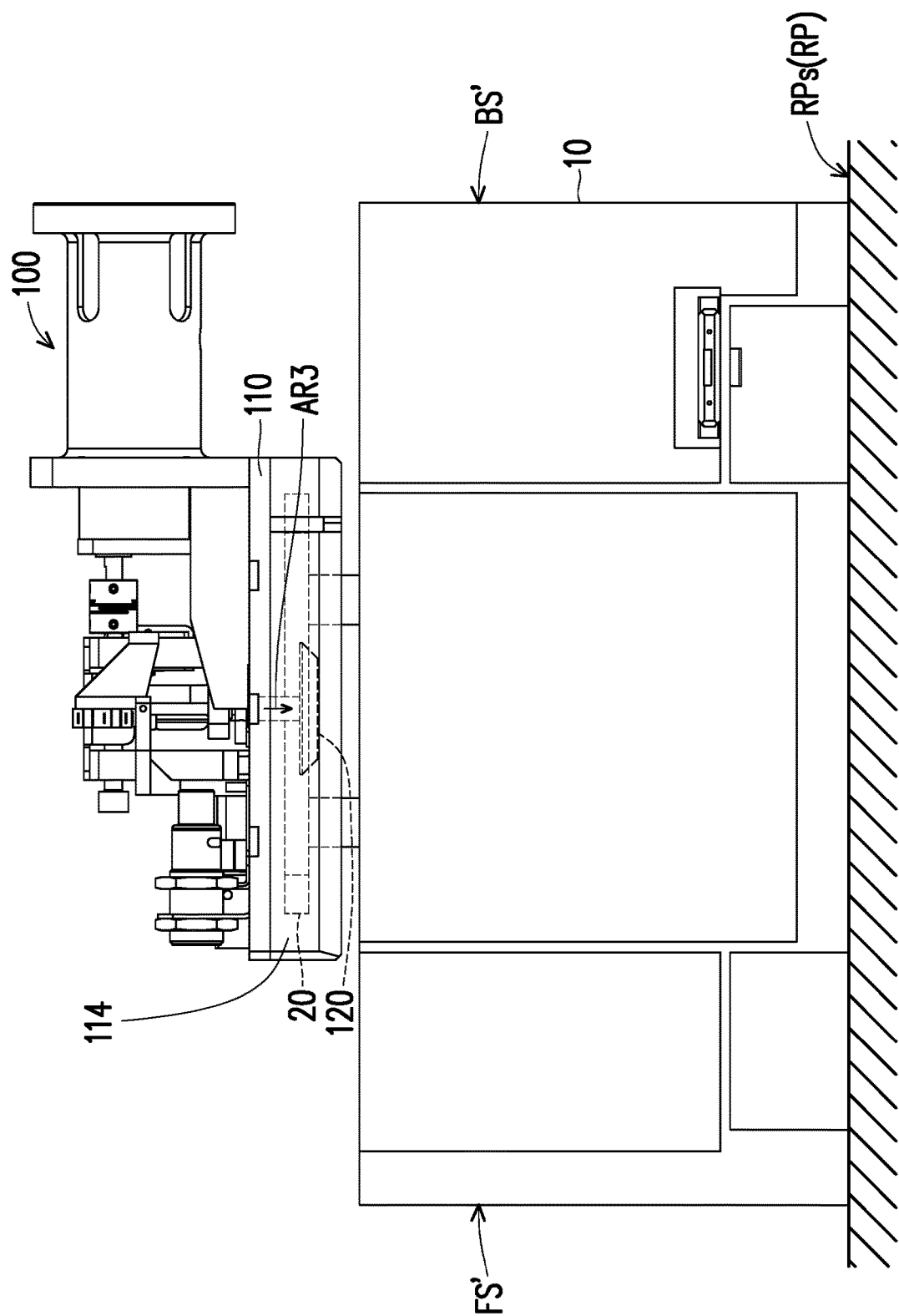

APPARATUS AND METHOD FOR AUTOMATED WAFER CARRIER HANDLING

BACKGROUND

A typical semiconductor fabrication facility includes a plurality of processing zones including semiconductor processing tools and wafer staging equipment. Each processing zone may include a stocker which temporarily holds multiple wafer carriers or in preparation for transporting wafer carriers to the load port of a semiconductor processing tool. A number of semiconductor wafers are commonly stored in the wafer carrier (e.g., a pod) which is used to move the semiconductor wafers throughout the fabrication facility to different semiconductor processing tools. Conventionally, the wafer carriers are transported to semiconductor processing tools and/or loaded onto load ports by human operators. In modern fabrication facilities, a great emphasis is placed on limiting the presence of human operators in the processing zone and improving the efficiency of semiconductor fabrication. Accordingly, a need exists for fabrication facility that can automatically load/unload wafer carriers in any orientation to and from a load port to minimize labor requirements and improve the efficiency of fabrication.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 4 is a schematic view illustrating a load port and an automated wafer carrier handling apparatus carrying a wafer carrier according to some embodiments of the present disclosure.

FIG. 6A to FIG. 6E are schematic views illustrating an automated wafer carrier handling apparatus at various stages of performing an operation method according to some embodiments of the present disclosure.

FIG. 7A to FIG. 7E are schematic views illustrating an automated wafer carrier handling apparatus at various stages of performing an operation method according to some embodiments of the present disclosure.

DETAILED DESCRIPTION

Figure 1A:
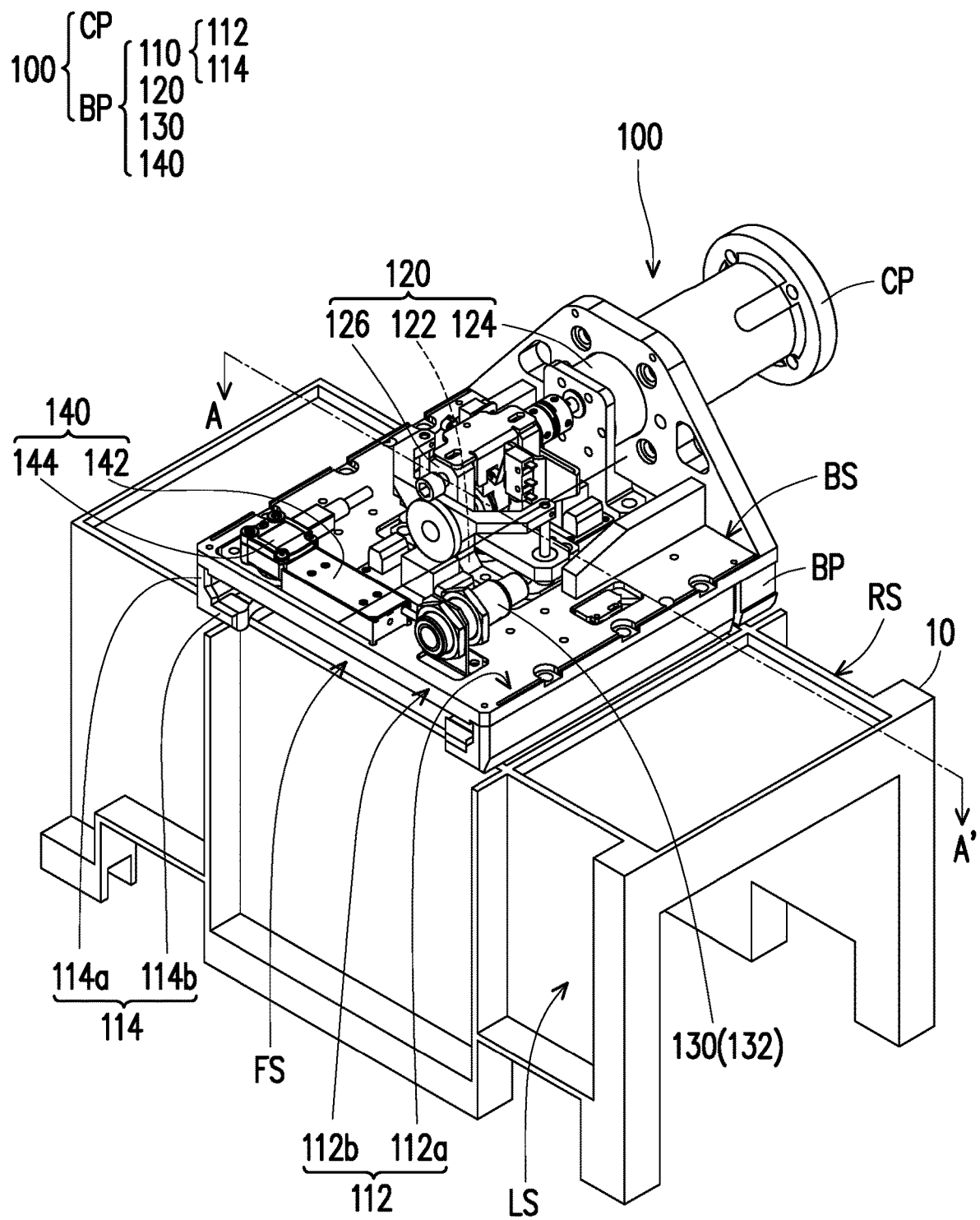
FIG. 1A is a schematic perspective view illustrating an automated wafer carrier handling apparatus carrying a wafer carrier according to some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Semiconductor fabrication facilities (e.g., FABs) may typically utilize manual movement of semiconductor wafers or semiconductor products in wafer carriers (e.g., pods, containers, etc.) around a FAB between different stations of wafer processing or storage. However, typical manual movement may be resource intensive and prone to inefficiency, due to requiring manual human movement and control. The disclosure provides embodiments of automated wafer carrier handling apparatus and operation method thereof for movement of a wafer carrier transferring to stations or load ports, thereby achieving minimization of labor requirement and improvement of the efficiency of fabrication.

Figure 1B:
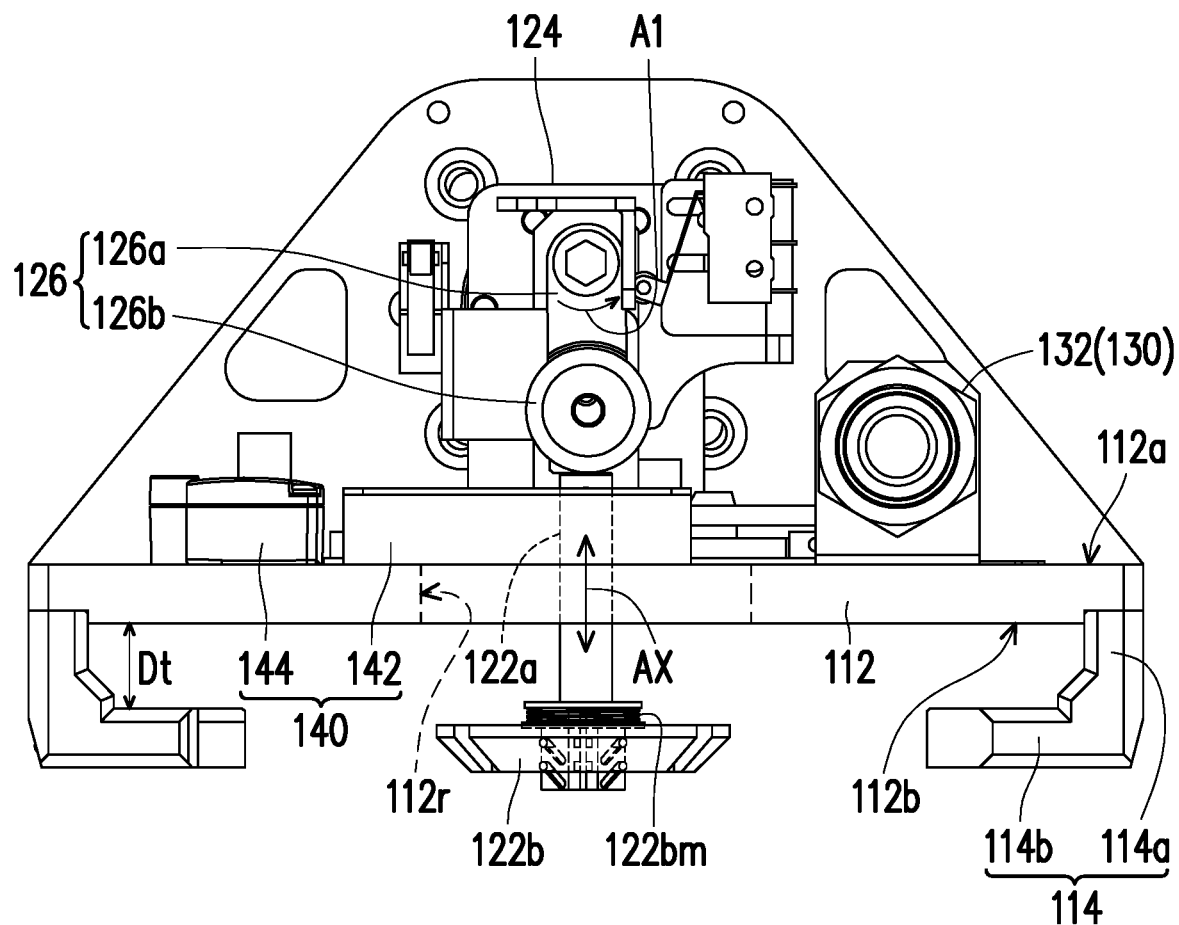
FIG. 1B is a schematic front view illustrating an automated wafer carrier handling apparatus according to some embodiments of the present disclosure.
Figure 1C:
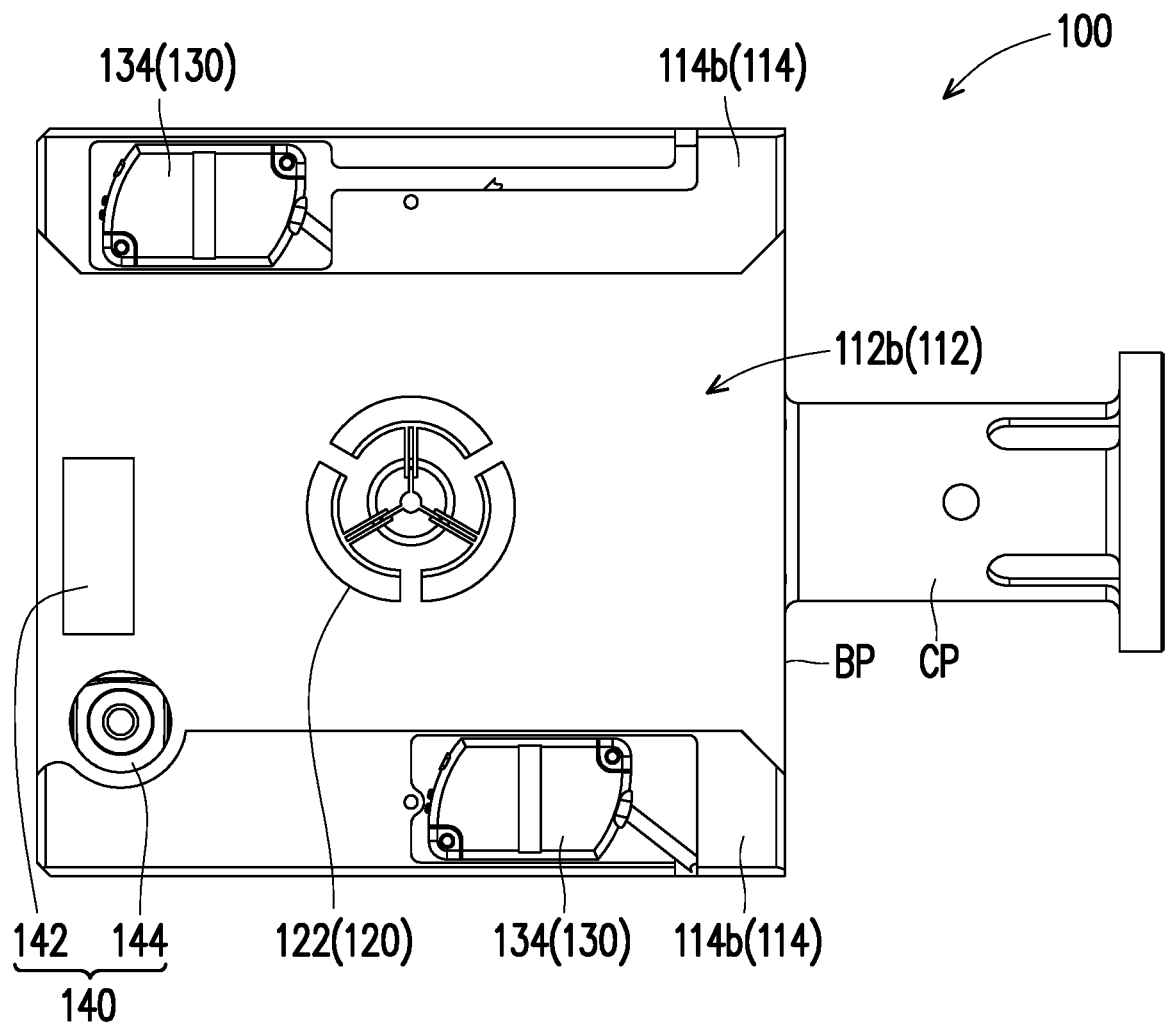
FIG. 1C is a schematic bottom view illustrating an automated wafer carrier handling apparatus according to some embodiments of the present disclosure.
Figure 1D:
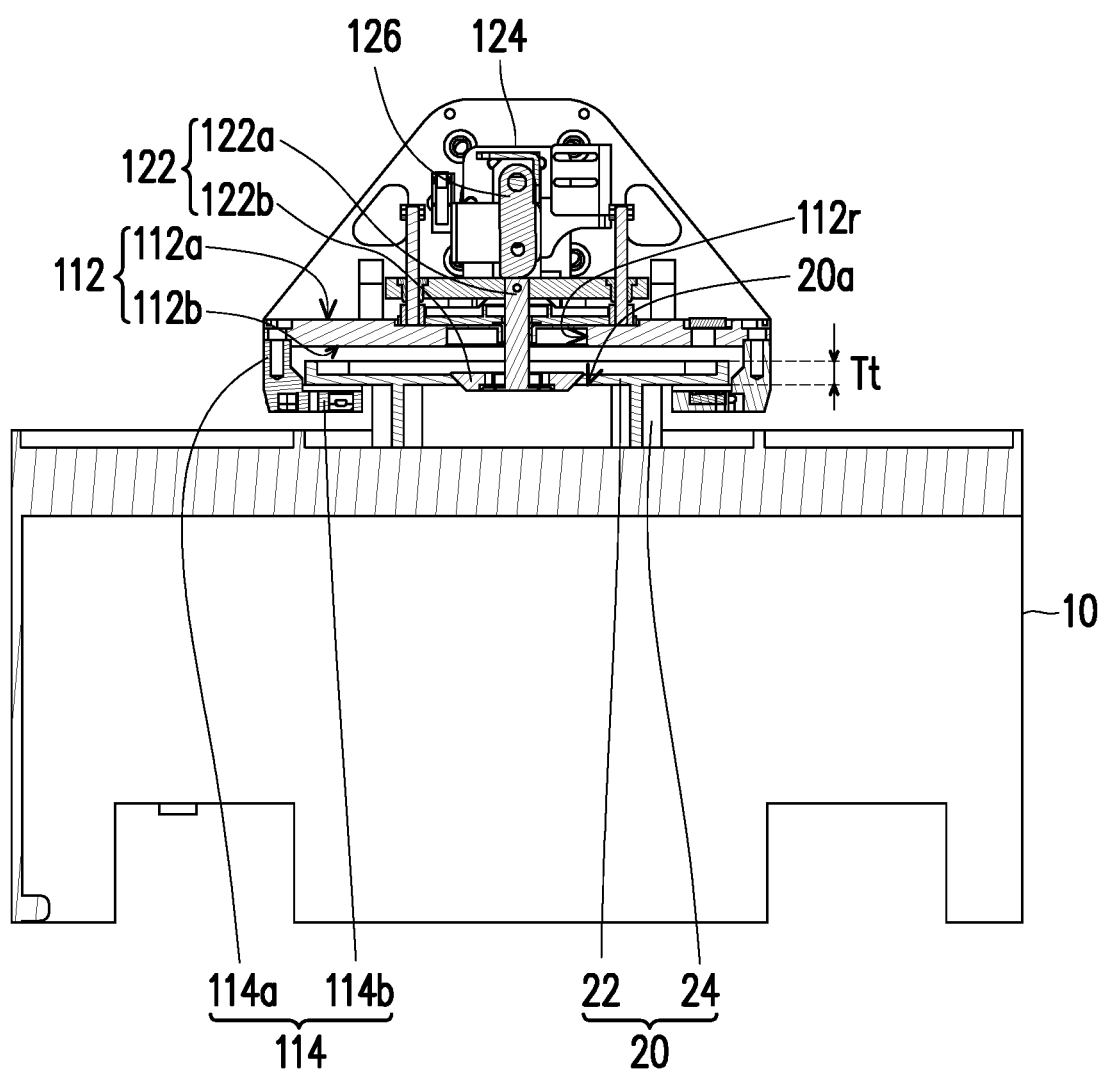
FIG. 1D is a schematic cross-sectional view taken along line A-A' in FIG. 1A according to some embodiments of the present disclosure.

FIG. 1A is a schematic perspective view illustrating an automated wafer carrier handling apparatus carrying a wafer carrier according to some embodiments of the present disclosure, FIG. 1B is a schematic front view illustrating an automated wafer carrier handling apparatus according to some embodiments of the present disclosure, FIG. 1C is a schematic bottom view illustrating an automated wafer carrier handling apparatus according to some embodiments of the present disclosure, and FIG. 1D is a schematic cross-sectional view taken along line A-A' in FIG. 1A according to some embodiments of the present disclosure. It should be noted that some components of the automated wafer carrier handling apparatus and the wafer carrier are omitted in the drawings above for ease of illustration.

Referring to FIGS. 1A-1D, an automated wafer carrier handling apparatus 100 is configured to carry a wafer carrier 10. The wafer carrier 10 may be or may include a pod which carries a cassette (e.g., frame cassette, tray cassette, etc.) holding one or more semiconductor products (not shown). For example, the semiconductor products are device wafers awaiting transfer to a semiconductor processing tool (not shown) for further processing. In some embodiments, the semiconductor products are final packages awaiting shipping to customers. The wafer carrier 10 may have a cuboid shape or other suitable shape. In some embodiments, a top flange 20 is mounted on the top of the wafer carrier 10 and configured to be clasped by the automated wafer carrier handling apparatus 100. In some embodiments, the top flange 20 is provided with a mushroom shape, although other shapes may be used. For example, as shown in FIG. 1D, the top flange 20 includes a first portion 22 and a second portion 24 connected to the first portion 22 and the wafer carrier 10. The automated wafer carrier handling apparatus 100 is adapted to be in contact with at least the first portion 22 of the top flange 20. In some embodiments, the automated wafer carrier handling apparatus 100 is configured to lift the top flange 20 along the short sides of the wafer carrier 10 as illustrated in FIG. 1A. In other embodiments, the automated wafer carrier handling apparatus 100 is configured to carry the top flange 20 along the long sides of the wafer carrier 10 as shown in FIG. 7F.

The automated wafer carrier handling apparatus 100 may include a base portion BP and a connecting portion CP connecting the base portion BP to a transport means (not shown). The connecting portion CP may be designed to fit on various types of transport means to open the possibility to various transporting machine designs. As used herein the term "transport means" may refer to any machine (e.g., autonomous cart moving on the ground, robotic arm connected to such as an overhead hoist transfer (OHT) system, overhead shuttle (OHS), rail guided vehicle (RGV), or the like), which includes functions of controlling, transporting, and carrying, etc.

In some embodiments, the base portion BP of the automated wafer carrier handling apparatus 100 includes a base frame 110 and an engaging mechanism 120 disposed on the base frame 110. For example, the base frame 110 includes a base plate 112 and a pair of support members 114, where the base plate 112 has a top surface 112a and a bottom surface 112b opposite to each other, and the pair of support members 114 are connected to the bottom surface 112b of the base plate 112. In some embodiments, the size of the top flange 20 is smaller than that of the wafer carrier 10, and the size of the base frame 110 may be designed based on the size of the top flange 20 to minimize the size of the automated wafer carrier handling apparatus 100. The minimization of the automated wafer carrier handling apparatus 100 allows itself to fit on various types of transport means.

The bottom surface 112b of the base plate 112 and the support members 114 may create a space that receives the top flange 20 mounted on the wafer carrier 10. In some embodiments, the space defined by the base plate 112 and the support members 114 is adapted to receive at least the first portion 22 of the top flange 20. In some embodiments, the support members 114 of the base frame 110 are provided as fork-shaped structures. In some embodiments, the support members 114 are designed to have the top flange 20 moved to the space under the base plate 112 from either the front side FS of the base frame 110 or the back side BS of the base frame 110. With such configuration, the top flange 20 mounted on the wafer carrier 10 may be moved into the space below the base plate 112 in different directions, thereby improving the efficiency and the flexibility of the automated wafer carrier handling apparatus 100.

In some embodiments, the support members 114 of the base frame 110 include two L-shaped brackets disposed on opposite sides of the bottom surface 112b of the base plate 112. For example, each of the L-shaped brackets includes a first part 114a extending along the sidewall of the base plate 112, and a second part 114b connected to the first part 114a and extending parallel to the bottom surface 112b. In some embodiments, the respective first part 114a of the support members 114 is extended from the bottom surface 112b of the base plate 112 in a substantially vertical direction, and the second part 114b is extended from an end of the first part 114a opposite to the base plate 112 in a substantially horizontal direction. The first part 114a and the second part 114b may be connected at a right or acute angle. The second parts 114b of two L-shaped brackets may be spatially apart from the bottom surface 112b of the base plate 112 and extend toward each other but not link together.

In some embodiments, the respective second part 114b spaces a minimum vertical distance Dt from the bottom surface 112b of the base plate 112 for receiving the top flange 20 mounted on the wafer carrier 10. For example, the minimum vertical distance Dt between the respective second part 114b and the bottom surface 112b of the base plate 112 is substantially greater than the thickness Tt of the first portion 22 of the top flange 20. In some embodiments, each of the support members 114 includes a protrusion (not labeled) mounted thereon for stopping the top flange 20 sliding beyond the support members 114. In some embodiments, the second portion 24 of the top flange 20 may be located between the pair of the support members 114 of the base frame 110 when the base plate 112 of the base frame 110 is driven to be moved over the top flange 20. When the base plate 112 is driven to be moved over the top flange 20, the second portion 24 of the top flange 20 may be or may not be in contact with the second parts 114b of the support members 114. In some embodiments, the periphery of the bottom surface of the first portion 22 of the top flange 20 is leaned against the second parts 114b of the support members 114 during transporting.

It should be noted that for ease of description, and without intending the structures disclosed herein to be limited to any particular orientation, a direction substantially perpendicular to planes of the bottom surface 112b of the base plate 112 will be referred to herein for convenience as a "vertical direction", and a direction substantially parallel to planes of the bottom surface 112b of the base plate 112 will be referred to herein for convenience as a "horizontal direction". It should be noted that the support members 114 may take various forms or include other fixing component(s), as long as the top flange 20 and/or the wafer carrier 10 may be stably carried by the base frame 110 during transferring.

In some embodiments, the engaging mechanism 120 of the automated wafer carrier handling apparatus 100 is disposed on the base plate 112. For example, the engaging mechanism 120 includes an active expansion component 122, a controller 124, and a stabilizer 126 disposed on and operably abutted against the active expansion component 122. In some embodiments, handling and/or transport operations are conducted under automatic control using the transport means, and the controller 124 may interface with the transport means for executing a set of programmable instructions stored in the transport means. The controller 124 may issue control signals for operating the motions of the stabilizer 126 and/or the active expansion component 122. For example, the controller 124 includes motor drivers, electric motors, gear motors, drive shafts, actuators, or other suitable driving mechanism that is configured to cause the stabilizer 126 and/or the active expansion component 122 to move relative to the base plate 112. For example, the motor driver of the controller 124 provides signals to drive the motor in operation, the motor rotates the shaft to drive the stabilizer 126 into motion, and the active expansion component 122 may perform movements via the motion of the stabilizer 126.

In some embodiments, as shown in FIG. 1B, the active expansion component 122 driven by the controller 124 is made to perform reciprocating movements along an axis AX. The active expansion component 122 may be configured to linearly reciprocate along the axis AX, where the axis AX may be parallel to the thickness direction of the base plate 112. For example, the active expansion component 122 includes a rod portion 122a penetrating through the base plate 112, and an engaging portion 122b connected to the rod portion 122a. The rod portion 122a of the active expansion component 122 may have one side connected to the engaging portion 122b, and the other side of the rod portion 122a may be abutted against the stabilizer 126 during operation. In some embodiments, the stabilizer 126 is driven by the controller 124 to move so as to press the rod portion 122a of the active expansion component 122 downwardly.

For example, the stabilizer 126 is configured to rotate in the direction indicated by the arrow A1 to be in contact with the active expansion component 122. It is understood that the counterclockwise rotation indicated by the arrow A1 is merely an example, and the stabilizer 126 may perform other rotation or movement to lean against the active expansion component 122 depending on the configuration. In some embodiments, the stabilizer 126 includes a strip portion 126a pivotably coupled to the controller 124 and a wheel portion 126b coupled to the bottom of the strip portion 126a. For example, when the stabilizer 126 is moving toward the active expansion component 122, the wheel portion 126b may be in physical contact with the rod portion 122a of the active expansion component 122 prior to the strip portion 126a. During operation of transferring the wafer carrier 10, the contact area of the strip portion 126a abutted against the rod portion 122a of the active expansion component 122 may be greater than the contact area of the wheel portion 126b abutted against the rod portion 122a of the active expansion component 122.

The rod portion 122a of the active expansion component 122 may be configured to perform up-and-down linear motion driven by the controller 124 via the stabilizer 126. The engaging portion 122b of the active expansion component 122 connected to the rod portion 122a may move up-and-down together with the rod portion 122a. In some embodiments, as shown in FIG. 1B, the engaging portion 122b is equipped with an elastic member 122bm and may be made to perform retractable movements. For example, the engaging portion 122b is retracted into the recess 112r (shown in FIG. 1D) of the base plate 112 in standby mode. In operation, the engaging portion 122b may be moved out of the recess 112r of the base plate 112 to be inserted into a hole 20a of the top flange 20 on the wafer carrier 10. For example, the top flange 20 is provided with the hole 20a penetrating through the first portion 22. In some embodiments, the hole 20a of the top flange 20 is deeper enough to penetrate through the first portion 22 and the second portion 24. Once the engaging portion 122b is moved out of the recess 112r of the base plate 112, the engaging portion 122b may be deployed and engaged with the top flange 20 on the wafer carrier 10. Details of the operating method will be described later in other embodiments.

Referring back to FIG. 1A, in some embodiments, the automated wafer carrier handling apparatus 100 includes a sensing unit 130 mounted on the base frame 110. The sensing unit 130 may be in communication with the transport means and/or the controller 124 of the engaging mechanism 120 for operations. The sensing unit 130 may include a plurality of sensors to perform various functions. For example, a first sensor 132 of the sensing unit 130 is configured to detect the distance between the automated wafer carrier handling apparatus 100 and a surrounding object. The first sensor 132 may be referred to as a collision avoidance sensor mounted on the front edge of the top surface 112a of the base plate 112. In some embodiments, the first sensor 132 is a non-contact sensor such as an ultrasonic sensor, an optical sensor, or the like. The operating details of the first sensor 132 will be described later in accompany with FIG. 4.

Referring to FIG. 1D with reference to FIG. 1A, the sensing unit 130 may include a second sensor 134 which is mounted on the base frame 110 and facing toward the wafer carrier 10 without shielding. In some embodiments, the second sensor 134 is a placement sensor configured to detect the placement status of the wafer carrier 10 by sensing, for example, both force and proximity of the wafer carrier 10. For example, the position of the wafer carrier 10 and/or the presence or absence of semiconductor products in the wafer carrier 10 may be confirmed by using the second sensor 134. In some embodiments, the base frame 110 is equipped with a plurality of second sensors 134. For example, the second sensors 134 are mounted on the bottom surfaces of the second parts 114b of respective support members 114, so that the second sensor 134 may face the wafer carrier 10 without shielding. In some embodiments, the second sensors 134 are diagonally disposed on respective support members 114 to ensure the wafer carrier 10 in place. In other embodiments, the second sensors 134 are mounted on the bottom surface 112b of the base plate 112 without shielding by the support members 114. For example, the second sensors 134 include various types of proximity sensors, such as but not limited to, capacitive, inductive, acoustic/sonic, magnetic, optical/photoelectric, and/or radar-based proximity sensors.

Other types of sensors may be employed to perform various functions. By using multiple sensors for detecting the wafer carrier before performing associated actions and transporting the wafer carrier 10, combined detection (e.g., force sensing, proximity sensing, etc.) may increase detection of intended contact on the wafer carrier and decrease detection of accidental contact on the wafer carrier. It should be appreciated that the type, the number, and the arrangement of the sensing unit 130 illustrated herein are merely exemplary and may be adjusted depending on the requirements, which construe no limitation in the disclosure.

In some embodiments, the sensing unit 130 optionally includes other sensor(s) that may be different types of sensors adapted to detect object presence in a sensing region (e.g., the area under the base frame 110). For example, the sensing unit 130 includes a present sensor configured to detect the presence or absence of the wafer carrier on a zone of interest. In some embodiments, the sensing unit 130 includes a photoelectric sensor which projects light beam toward a specific region of detection under the base plate 112 in which the wafer carrier 10 is expected to be present and detects the wafer carrier 10 in the specific region of detection on the basis of a value relating to the light beam reflected by the wafer carrier. In some embodiments, the sensing unit 130 includes a reflective type photoelectric sensor and a proximity sensor. Alternatively, the sensing unit 130 includes the same or similar type(s) of sensor and performs detection simultaneously. It should be noted that illustration of the sensing unit 130 is merely exemplary, and the number and the types of the sensors construe no limitation in the disclosure.

Referring back to FIG. 1A, in some embodiments, the automated wafer carrier handling apparatus 100 includes an image alignment system 140 adapted to increase the certainty of target location identification and position measurement accuracy. The image alignment system 140 may include a light source 142 and an optical detection device 144 optically coupled to the light source 142. For example, the light source 142 of the image alignment system 140 includes light emitting diode(s) configured to illuminate a surface of a target object, and the optical detection device 144 includes a camera lens, an image sensor (e.g., charge-coupled device (CCD) image sensor, complementary metal-oxide semiconductor (CMOS) image sensor, or the like), and/or other suitable component(s) for identifying and positioning the target wafer carrier. In some embodiments, the light source 142 and the optical detection device 144 are disposed side by side on the base frame 110. For example, the camera lens of the optical detection device 144 and the light source 142 are exposed by the bottom surface 112b of the base plate 112 for imaging/scanning the object right under the base frame 110. In some embodiments, the light source 142 of the image alignment system 140 may be located off axis from the camera lens and the image sensor of the optical detection device 144 detecting the light reflected from the target wafer carrier 10 being scanned. It should be noted that other types of components may be employed in the image alignment system 140 to perform various detecting/imaging functions. The operating details of the image alignment system 140 will be described later in accompany with FIG. 5.

Figure 2A:
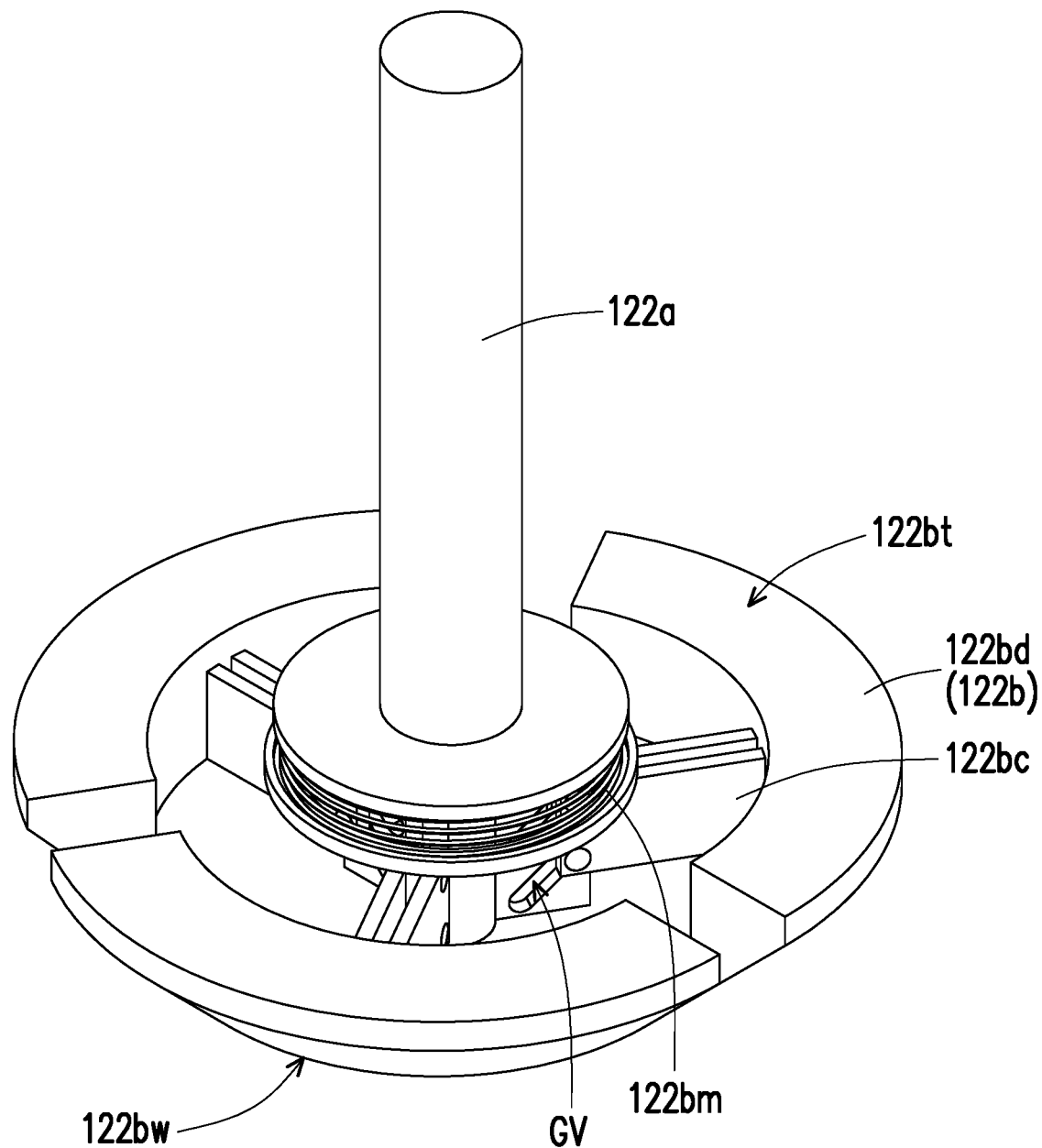
FIG. 2A is an enlarged perspective view of an engaging mechanism in an expanded state according to some embodiments of the present disclosure.
Figure 2B:
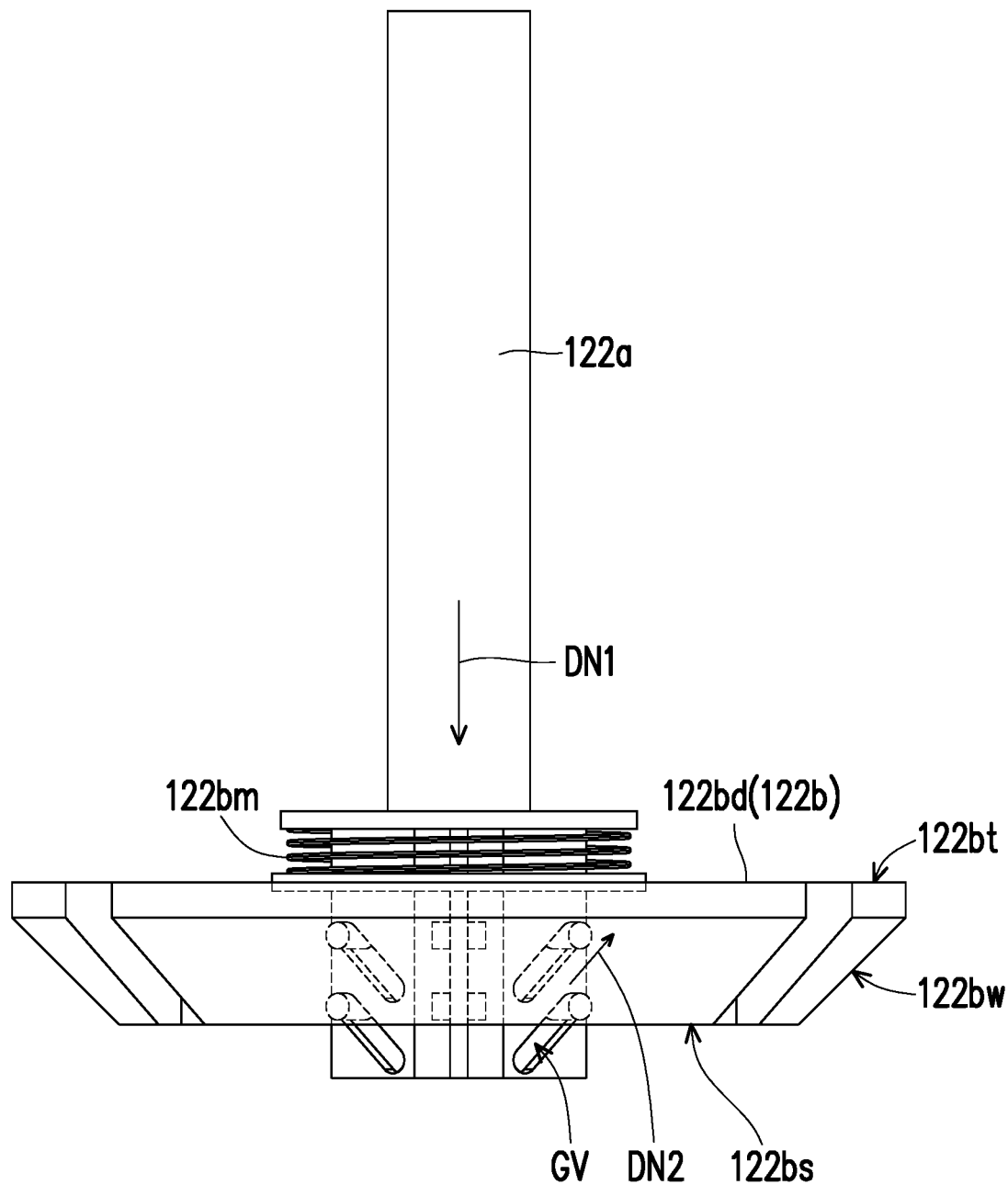
FIG. 2B is an enlarged side view of an engaging mechanism in an expanded state according to some embodiments of the present disclosure.
Figure 2C:
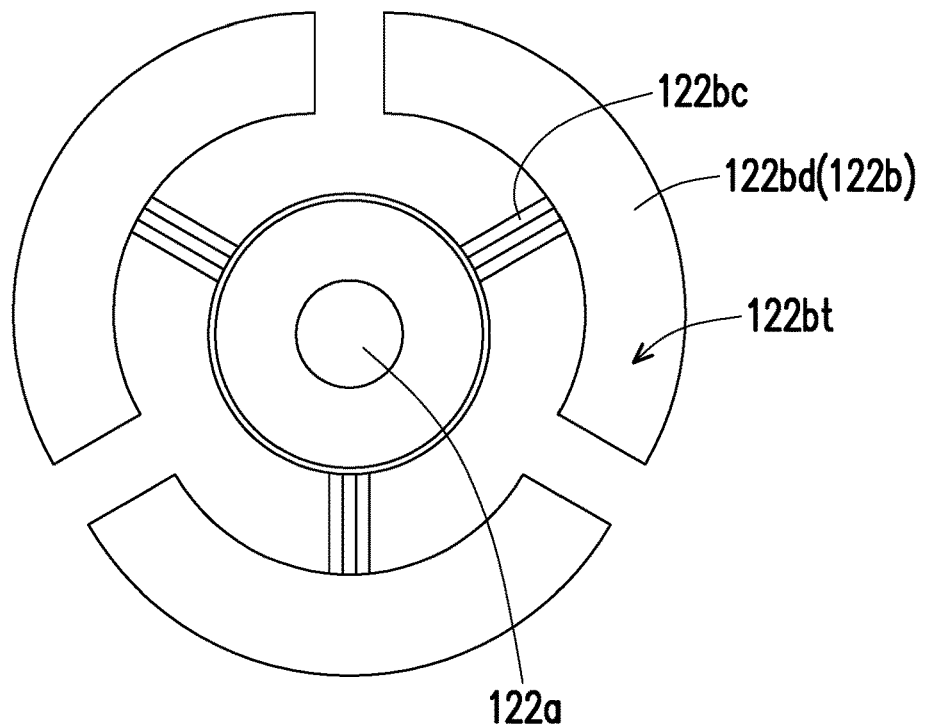
FIG. 2C is an enlarged top view of an engaging mechanism in an expanded state according to some embodiments of the present disclosure.
Figure 2D:
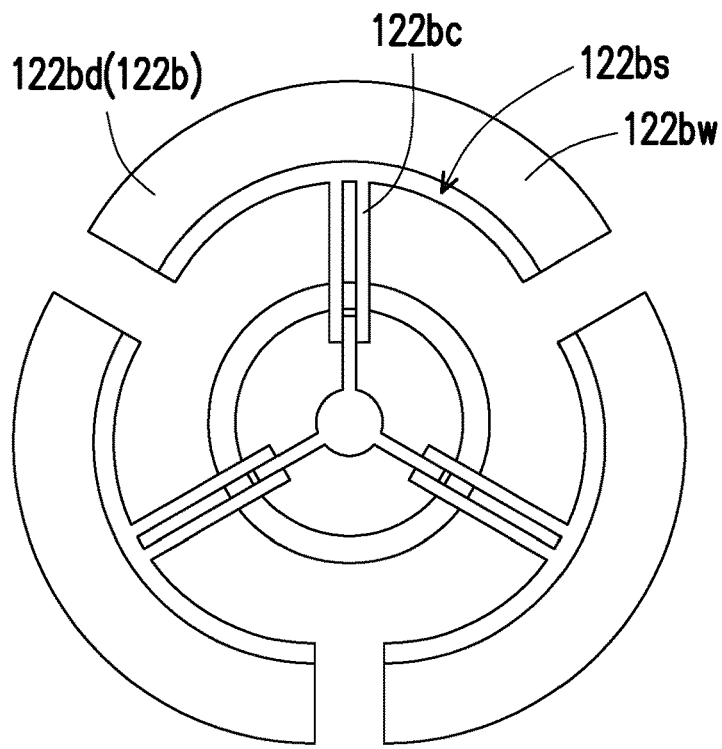
FIG. 2D is an enlarged bottom view of an engaging mechanism in an expanded state according to some embodiments of the present disclosure.
Figure 3A:
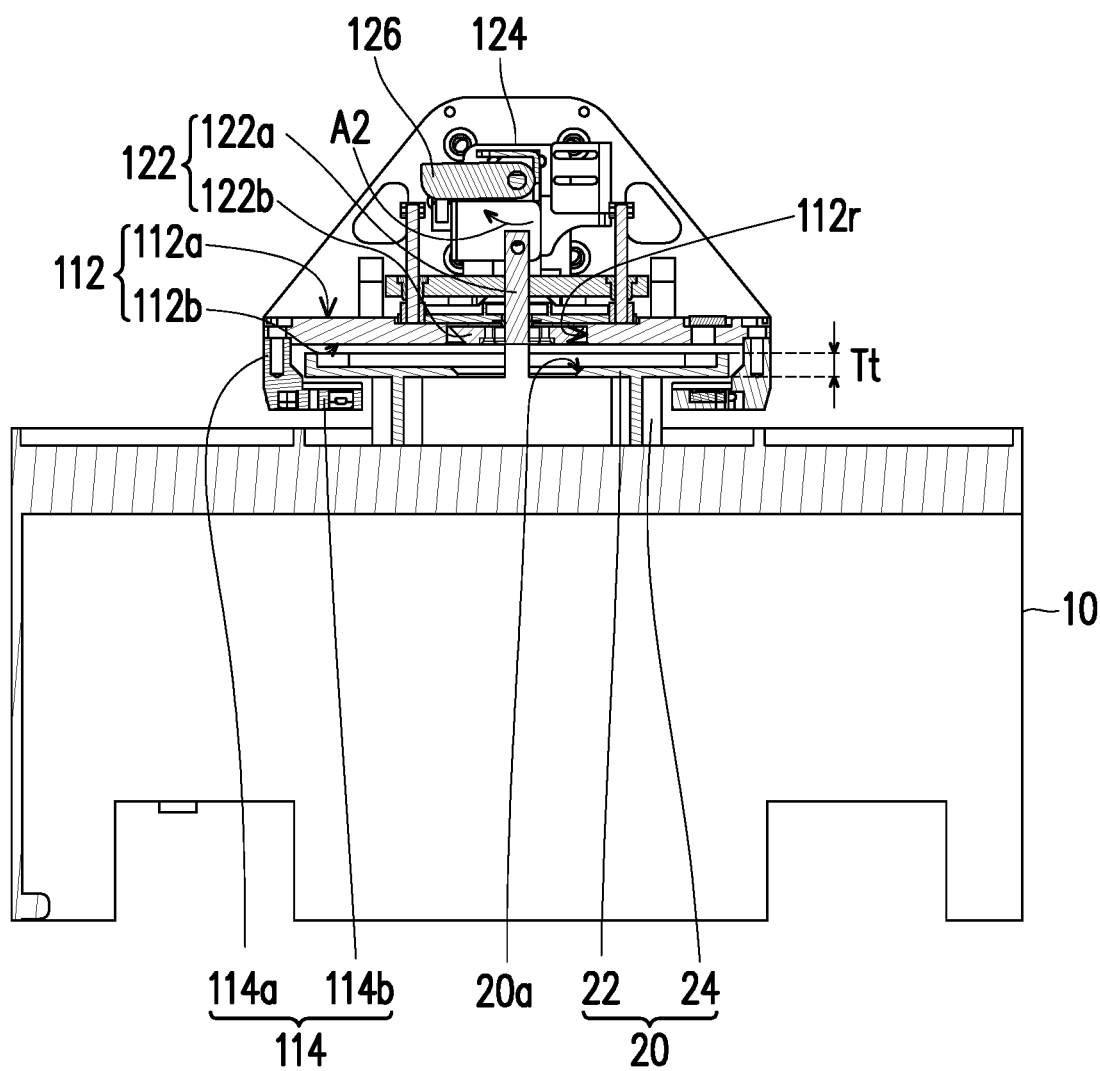
FIG. 3A is a cross-sectional view illustrating an automated wafer carrier handling apparatus without engaging a wafer carrier according to some embodiments of the present disclosure.
Figure 3B:
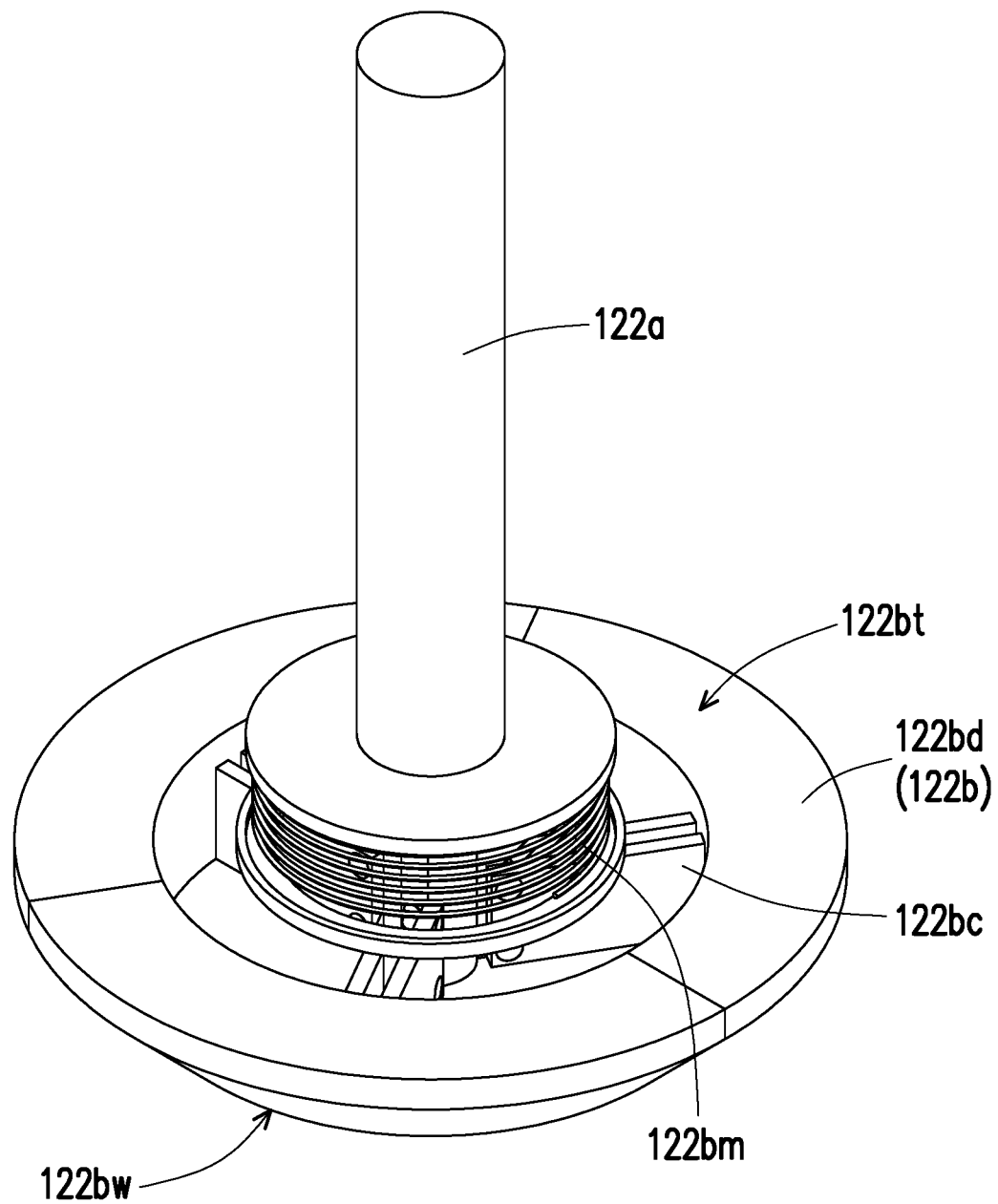
FIG. 3B is an enlarged perspective view of an engaging mechanism in a contracted state according to some embodiments of the present disclosure.
Figure 3C:
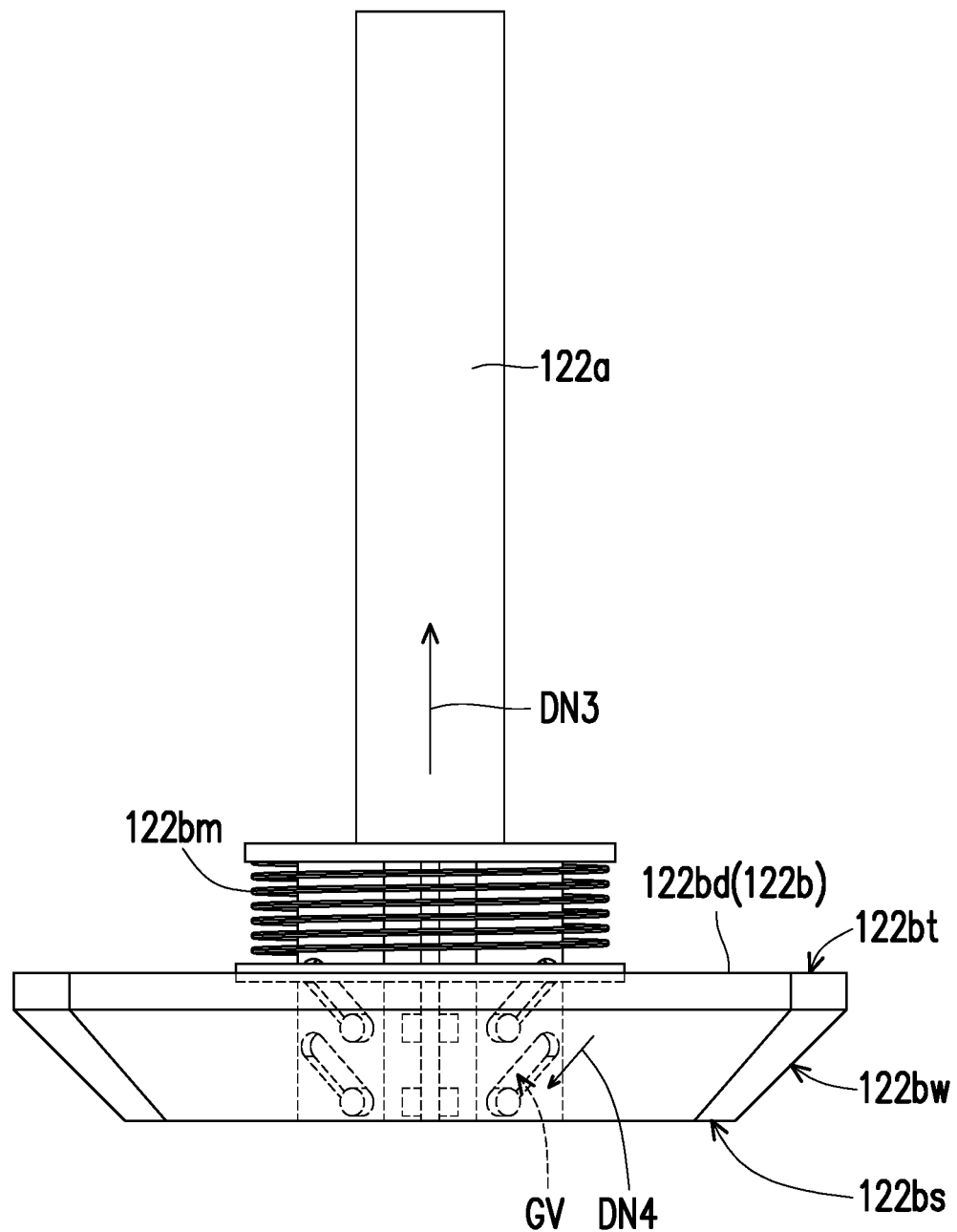
FIG. 3C is an enlarged side view of an engaging mechanism in a contracted state according to some embodiments of the present disclosure.
Figure 3D:
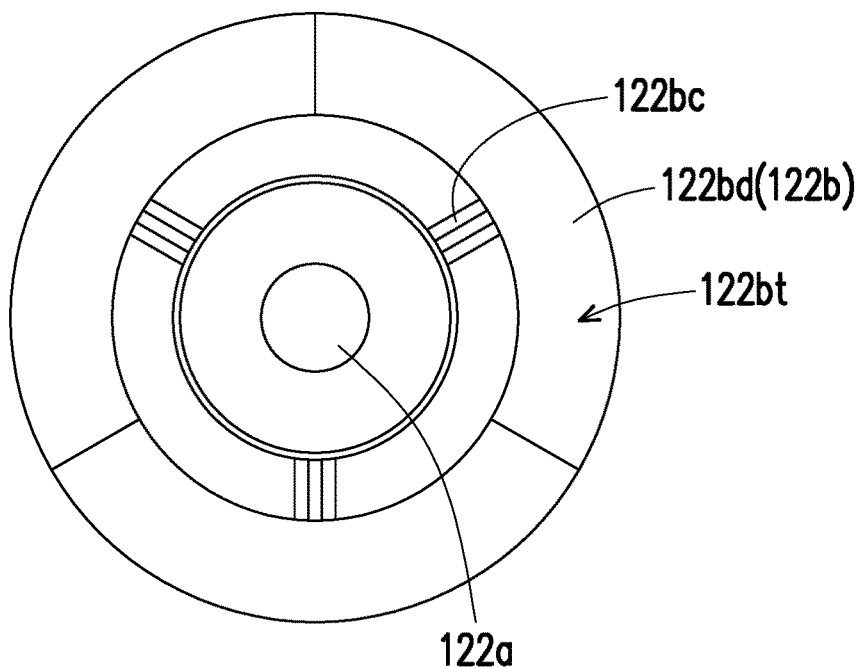
FIG. 3D is an enlarged top view of an engaging mechanism in a contracted state according to some embodiments of the present disclosure.
Figure 3E:
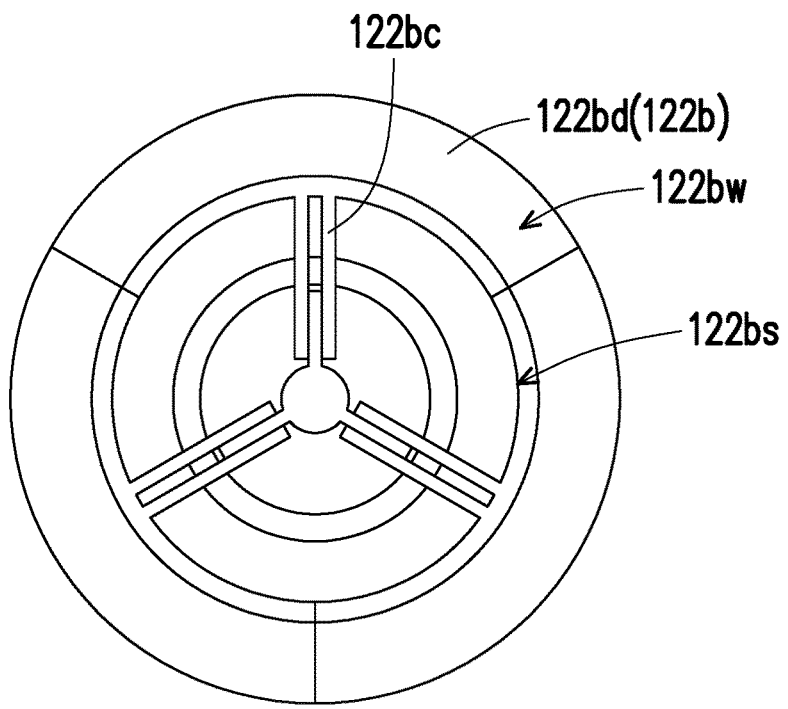
FIG. 3E is an enlarged bottom view of an engaging mechanism in a contracted state according to some embodiments of the present disclosure.

FIG. 2A is an enlarged perspective view of an engaging mechanism in an expanded state according to some embodiments of the present disclosure, FIG. 2B is an enlarged side view of an engaging mechanism in an expanded state according to some embodiments of the present disclosure, FIG. 2C is an enlarged top view of an engaging mechanism in an expanded state according to some embodiments of the present disclosure, and FIG. 2D is an enlarged bottom view of an engaging mechanism in an expanded state according to some embodiments of the present disclosure. FIG. 3A is a cross-sectional view illustrating an automated wafer carrier handling apparatus without engaging a wafer carrier according to some embodiments of the present disclosure, FIG. 3B is an enlarged perspective view of an engaging mechanism in a contracted state according to some embodiments of the present disclosure, FIG. 3C is an enlarged side view of an engaging mechanism in a contracted state according to some embodiments of the present disclosure, FIG. 3D is an enlarged top view of an engaging mechanism in a contracted state according to some embodiments of the present disclosure, and FIG. 3E is an enlarged bottom view of an engaging mechanism in a contracted state according to some embodiments of the present disclosure.

Referring to FIGS. 2A-2D with reference to FIG. 1D, in the operation mode, the engaging portion 122b of the active expansion component 122 is in an expanded state. The controller 124 of the engaging mechanism 120 may control a motion direction of the active expansion component 122 via the stabilizer 126. For example, in the operation mode, the controller 124 applies a force upon the stabilizer 126 so that the stabilizer 126 is driven to press down the rod portion 122a of the active expansion component 122. The active expansion component 122 driven by the controller 124 via the stabilizer 126 may be lowered vertically relative to the base plate 112. The engaging portion 122b of the active expansion component 122 may be correspondingly lowered down together with the rod portion 122a of the active expansion component 122.

In some embodiments, once the engaging portion 122b is moved downwardly out of the recess 112r of the base plate 112, the expanding parts 122bd of the engaging portion 122b may extend outwardly from the center of the structure by a distance. The distance, for example, is limited by the extending parts 122bc and/or the elastic member 122bm. Each of the expanding parts 122bd is connected to one of the extending part 122bc, and the extending parts 122bc are movably coupled to the rod portion 122a. The elastic member 122bm may be sleeved on the rod portion 122a and configured to drive the extending parts 122bc to perform a motion. For example, the extending parts 122bc are moved along the grooves GV on the bottom of the rod portion 122a and below the elastic member 122bm. In some embodiments, the respective groove GV extends in an inclined direction relative to the length direction of the rod portion 122a.

In some embodiments, with reference to FIG. 2B and FIG. 1D, in the operation mode, the elastic member 122bm is compressed in a direction DN1 by the stabilizer 126. During compression of the elastic member 122bm, the extending parts 122bc may move in a direction DN2 along the grooves GV. The expanding parts 122bd may be moved together with the extending parts 122bc and may be separated from one another by the distance. As a result of this movement of the expanding parts 122bd and the elastic member 122bm, the extending parts 122bc are abutted against the upper ends of the grooves GV. For example, the direction DN1 is parallel to the normal direction of top surfaces 122bt of the expanding parts 122bd, and the direction DN2 is an inclined direction relative to the direction DN1. In some embodiments, an acute angle is between the directions DN1 and DN2. In other embodiments, a right angle or an obtuse angle may be between the directions DN1 and DN2. In some embodiments, the elastic member 122bm is a compression spring as illustrated in FIGS. 2A-2B. In other embodiments, the elastic member 122bm includes torsion spring, coil spring, or other types of elastic member.

In some embodiments, the engaging portion 122b may be tapered from the top to the bottom. For example, the respective expanding part 122bd of the engaging portion 122b is in the shape of a truncated cone. For example, the respective expanding part 122bd has a bottom surface 122bs, a top surface 122bt wider than the bottom surface 122bs, and an inclined sidewall 122bw connected the top surface 122bs and the bottom surface 122bs. It should be noted that the engaging portion 122b illustrated in the shape of the circular truncated cone is merely an example, the engaging portion 122b may take various forms (e.g., cube, prism, sphere, polygonal truncated cone, etc.) as long as the engaging portion 122b may be engaged with the top flange 20 mounted on the wafer carrier 10. In some embodiments in which the engaging portion 122b is in the shape of a truncated cone, the expanding parts 122bd of the engaging portion 122b move radially away from the center of the structure. In some embodiments, the expanding parts 122bd are deployed outwardly, allowing the engaging portion 122b to be engaged with the top flange 20 mounted on the wafer carrier 10. The engaging portion 122b of the active expansion component 122 may consist of a plurality of expanding parts 122bd which are brought together via the elastic member 122bm. For example, the expanding parts 122bd may be retractable vane-shaped structures limited by the elastic member 122bm and/or the recess 112r of the base plate 112. It should be noted that illustration of three expanding parts 122bd is merely an example, and the number and the forms of the expanding parts 122bd construe no limitation in the disclosure.

Referring to FIGS. 3A-3E, in the standby mode, the engaging portion 122b of the active expansion component 122 is in a contracted state and may be accommodated within the recess 112r of the base plate 112. In some embodiments, the second portion 24 of the top flange 20 connected to the first portion 22 and the top of the wafer carrier 10 defines a gap G between the first portion 22 of the top flange 20 and the top surface of the wafer carrier 10. During the operation of moving the base frame 110 into the gap G between the top flange 20 and the wafer carrier 10, the engaging portion 122b of the active expansion component 122 is in a contracted state and accommodated within the recess 112r to avoid collision and damage to the top flange 20. In some embodiments, the thickness of the engaging portion 122b is substantially equal to the depth of the recess 112r of base plate 112, so that the engaging portion 122b of the active expansion component 122 may not be protruded from the base plate 112. In other embodiments, the thickness of the engaging portion 122b is slightly greater than or less than the depth of the recess 112r of base plate 112. It should be noted that the thickness of the engaging portion 122b construes no limitation in the disclosure as long as the engaging portion 122b does not intervene the movement of the top flange 20 and the wafer carrier 10 when moving the automated wafer carrier handling apparatus 100 over the wafer carrier 10.

In some embodiments, as shown in FIG. 3A, in the standby mode, the stabilizer 126 is driven by the controller 124 to rotate in the direction indicated by the arrow A2 so as to release the rod portion 122a of the active expansion component 122. It is understood that the clockwise rotation indicated by the arrow A2 is merely an example, and the stabilizer 126 may perform other rotation or movement to release the active expansion component 122 depending on the configuration. For example, with reference to FIG. 1B, in the standby mode, the strip portion 126a moves together with the wheel portion 126b away from the rod portion 122a of the active expansion component 122 so as to release the active expansion component 122. For example, the extending parts 122bc and the expanding parts 122bd may obtain the return force based on the elastic restoration force of the compressed elastic member 122bm. Since the pressing force is no longer applied to the rod portion 122a of the active expansion component 122, the elastic member 122bm compressively deformed is elastically restored and thus the rod portion 122a may be moved upwardly due to the elastic restoration force.

In some embodiments, as shown in FIG. 3C, the elastic member 122bm is elastically restored along a direction DN3 in the standby mode, where the direction DN3 is opposite to the direction DN1 labeled in FIG. 2B. The elastically restored elastic member 122bm may make the extending parts 122bc move along the grooves GV in a direction DN4 to be abutted against the lower ends of the grooves GV. A restoring force attributable to the displacement of the elastic member 122bm may create a force to return the extending parts 122bc and the expanding parts 122bd. Accordingly, the expanding parts 122bd are pulled back to the contracted state. In the contracted state, the expanding parts 122bd are connected to one another. In some embodiments, because of the force of elastic restoration, the expanding parts 122bd are retracted to form a ring shape in the standby mode, as illustrated in the top and bottom views of FIGS. 3D-3E.

FIG. 4 is a schematic view illustrating a load port and an automated wafer carrier handling apparatus carrying a wafer carrier according to some embodiments of the present disclosure. It should be noted that the receiving place, the wafer carrier, and the automated wafer carrier handling apparatus may not be drawn to scale and are used for illustration purposes only. Referring to FIG. 4, in some embodiments, the automated wafer carrier handling apparatus 100 carrying the wafer carrier 10 is approaching a receiving place RP for loading. For example, the receiving place RP is configured to receive the wafer carrier 10. In some embodiments, the receiving place RP is a load port affixed to a front end of the semiconductor processing tool or semiconductor manufacturing equipment (not shown). In other embodiments, the receiving place RP is a platform or a storage rack located in, for example, a buffering zone awaiting transfer to next station or shipping. In some embodiments, the first sensor 132 of the sensing unit 130 is configured to detect obstructions during transporting. For example, the first sensor 132 is configured to emit a light beam, an ultrasonic sound wave, or the like, and receive reflected light or sound wave to calculate the time for the light or the sound wave to reflect back to the first sensor 132, thereby determining the distance between a surrounding object and the automated wafer carrier handling apparatus 100.

In some embodiments, the first sensor 132 detects the object (e.g., another wafer carrier 10') on the receiving place RP, and the first sensor 132 is configured to receive conditions and report to the controller mounted on the automated wafer carrier handling apparatus 100 or mounted on the transport means to determine whether and/or when to stop the movement of the automated wafer carrier handling apparatus 100. For example, the automated wafer carrier handling apparatus 100 stops moving at the stop line SL or slows down before reaching the stop line SL to avoid collisions, thereby protecting the wafer carrier 10 from damage and reducing scrap. In some embodiments in which the automated wafer carrier handling apparatus 100 is attempted to grasp the target wafer carrier from the intended position (e.g., load port, storage rack, platform, etc.), the first sensor 132 of the sensing unit 130 is configured to avoid known stationary obstacles in traveling and detect the location of the target wafer carrier. For example, the first sensor 132 may detect the distance between the target wafer carrier and the automated wafer carrier handling apparatus 100, so that the automated wafer carrier handling apparatus 100 controlled by the transport means is positioned to the target wafer carrier by a certain clearance without collision. In some embodiments, when the first sensor 132 detects obstructions or object on the receiving place RP, the automated wafer carrier handling apparatus 100 carrying the wafer carrier 10 may change the predetermined route to be moved to another receiving place or turn to buffering zone for placement.

Figure 5:
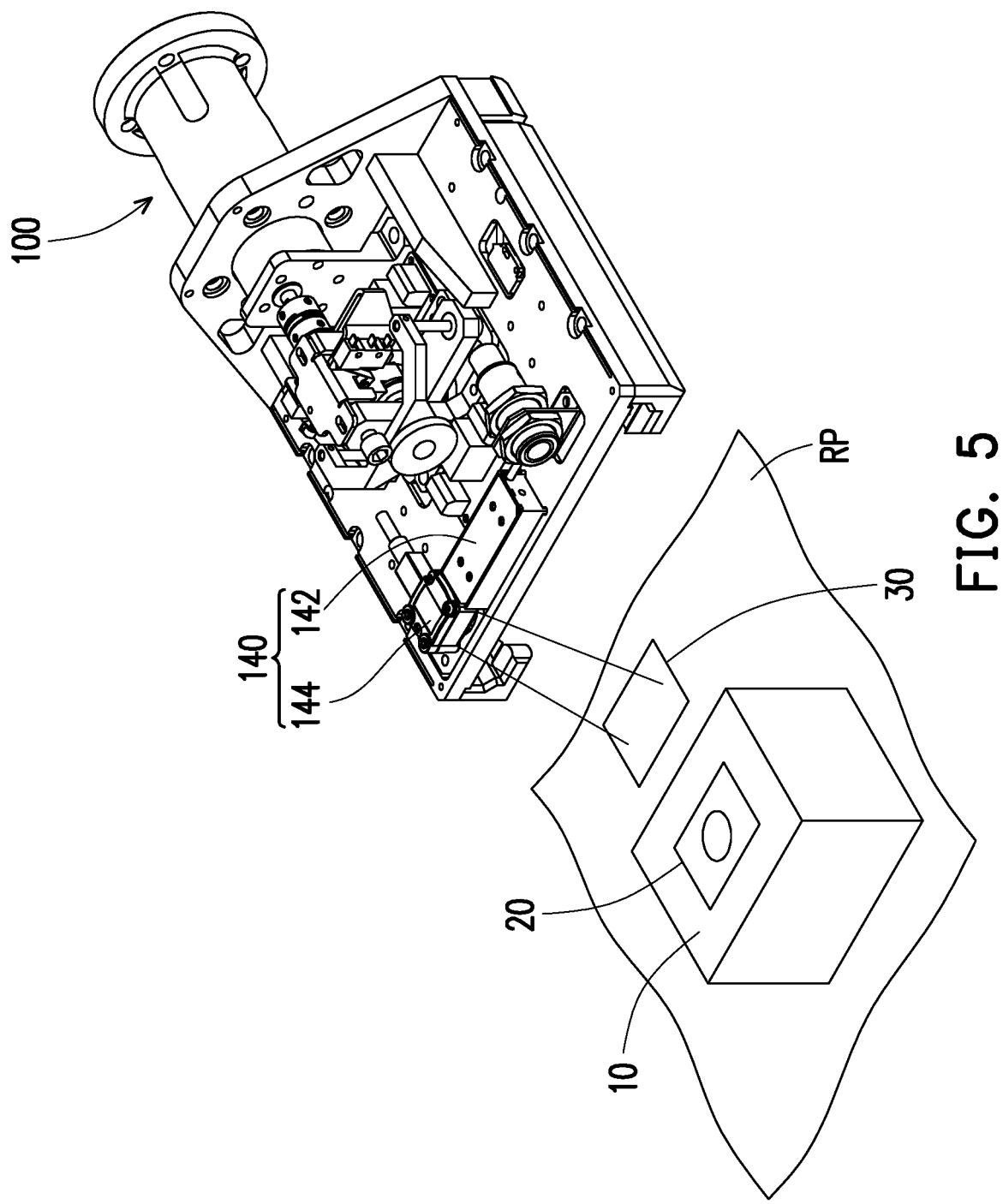
FIG. 5 is a schematic view illustrating an automated wafer carrier handling apparatus detecting a wafer carrier according to some embodiments of the present disclosure.

FIG. 5 is a schematic view illustrating an automated wafer carrier handling apparatus detecting a wafer carrier according to some embodiments of the present disclosure. It should be noted that the wafer carrier, the top flange, and the automated wafer carrier handling apparatus may not be drawn to scale and are used for illustration purposes only. Referring to FIG. 5, the image alignment system 140 of the automated wafer carrier handling apparatus 100 is configured to read or detect an optical feature 30 for positioning and/or identification. The optical feature 30 may be disposed on the receiving place RP. In some embodiments, the optical feature 30 is positioned at a predetermined location on the receiving place RP, so that when the automated wafer carrier handling apparatus 100 is driven along a predetermined route (not shown) and moved toward the wafer carrier 10 for coupling the top flange 20, the optical feature 30 is detected by the image alignment system 140. The position information (e.g., coordination location) may be read from the optical feature 30 by the image alignment system 140 of the automated wafer carrier handling apparatus 100 according to detection and/or scanning of the optical feature 30 positioned at the predetermined location along the predetermined route of the automated wafer carrier handling apparatus 100.

In some embodiments, the optical feature 30 is disposed on the wafer carrier 10, and the image alignment system 140 is configured to detect/scan the optical feature 30 for reading the information of the wafer carrier 10. For example, the optical detection device 144 of the image alignment system 140 is configured to be responsive to the light source 142 (e.g., visible lights, infrared lights, ultraviolet lights, or any combination thereof), and received either directly from the light source 142 or by reflection. In some embodiments, the optical feature 30 includes a machine-readable identifying code (e.g., barcode, QR code, or data matrix), a text, a figure, or a combination thereof. For example, the optical feature 30 includes a barcode, and the image alignment system 140 includes a barcode reader for detecting the barcode on the optical feature 30. By reading/scanning the optical feature 30, the automated wafer carrier handling apparatus 100 may increase the certainty of location and identification accuracy regarding to the wafer carrier 10.

FIG. 6A to FIG. 6E are schematic views illustrating an automated wafer carrier handling apparatus at various stages of performing an operation method according to some embodiments of the present disclosure. The automated wafer carrier handling apparatus 100 may be used to automatically handle and transport the wafer carrier 10 from an originating location to a destination location among stations in the FAB without having to wait for human operator to load/unload the wafer carriers 10. The automated wafer carrier handling apparatus 100 may be configured to grasp the top flange 20 mounted on the wafer carrier 10 in various orientations. FIGS. 6A-6E shows that the automated wafer carrier handling apparatus 100 is configured to lift the top flange 20 along the short sides of the wafer carrier 10. The operating method of the automated wafer carrier handling system includes at least the following steps. While the operation method is illustrated and described below as a series of acts or events, it will be appreciated that the illustrated ordering of such acts or events are not to be interpreted in a limiting sense.

Figure 6A:
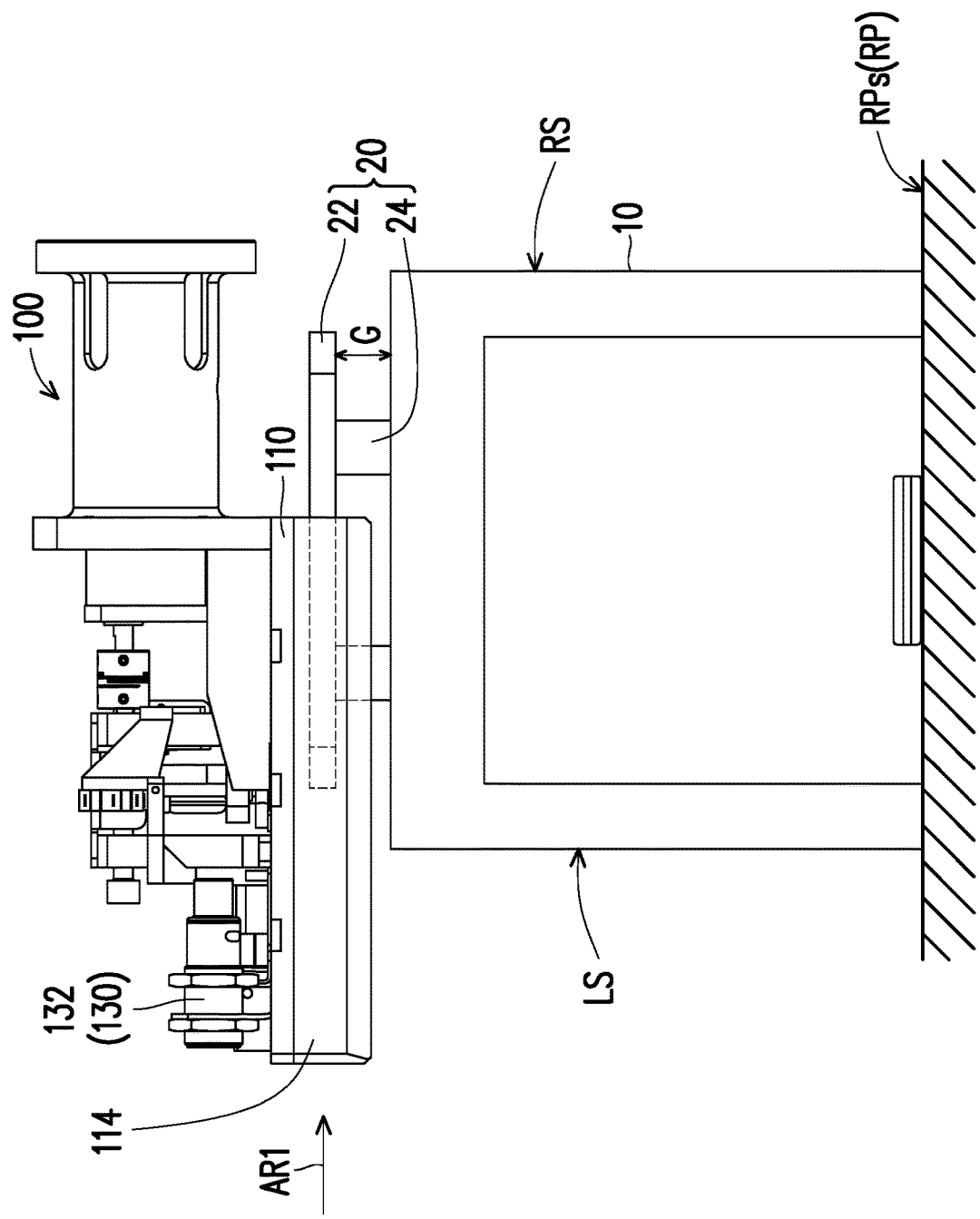

Referring to FIGS. 6A-6B, the wafer carrier 10 accommodating a plurality of semiconductor products therein is disposed on the receiving surface RPs of the receiving place RP. In some embodiments, the receiving place RP is viewed as an originating location. The automated wafer carrier handling apparatus 100 controlled by the transport means may be moved to the originating location and to approach the wafer carrier 10. Then, the automated wafer carrier handling apparatus 100 may be positioned at the certain elevation substantially above the top surface of the wafer carrier 10. Next, the automated wafer carrier handling apparatus 100 may be driven to perform a linear motion along the direction indicated by the arrow AR1. For example, the automated wafer carrier handling apparatus 100 is moved along the horizontal direction from the left side LS of the wafer carrier 10 to the right side RS of the wafer carrier 10. For example, the support members 114 of the base frame 110 slides into the gap G between the top flange 20 and the wafer carrier 10 until the automated wafer carrier handling apparatus 100 is positioned on the top flange 20. With reference to FIG. 3A, the active expansion component 122 of the automated wafer carrier handling apparatus 100 may be positioned above the hole 20a of the top flange 20. At this stage, the base frame 110 of the automated wafer carrier handling apparatus 100 is not in physical contact with the top flange 20.

In some embodiments, during the movement of approaching the wafer carrier 10, the first sensor 132 of the sensing unit 130 may sense obstructions within a zone of interest and/or the presence of the wafer carrier 10, thereby avoiding collisions and/or detecting the locations. With reference to FIG. 5, in some embodiments, during the movement of approaching the wafer carrier 10, the image alignment system 140 may detect the optical feature 30 near/on the wafer carrier 10 to identify the position along the predetermined route. With reference to FIG. 1C, in some embodiments, during the movement of sliding the support members 114 into the gap G, the second sensor(s) 134 may be configured to sense whether or not the wafer carrier 10 exists in the detection area (e.g., the region under the base frame 110) and detect the relative position of the wafer carrier 10, allowing the automated wafer carrier handling apparatus 100 to be positioned at a predetermined position above the wafer carrier 10 for performing the next action.

Figure 6C:
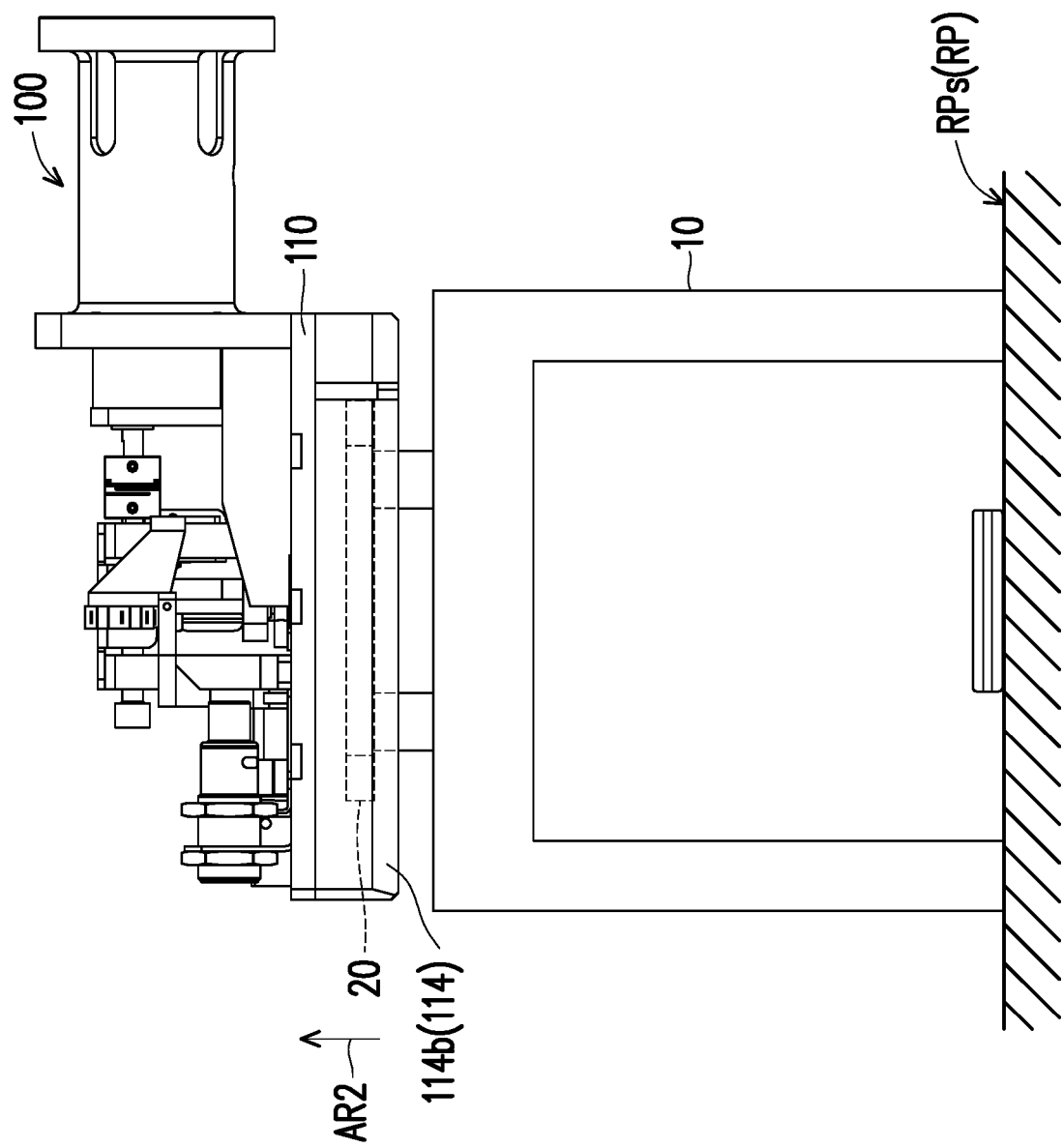

Referring to FIG. 6C, the automated wafer carrier handling apparatus 100 provides limitation in at least one degree of freedom of movement of the top flange 20 when transporting the wafer carrier 10. For example, after positioning the automated wafer carrier handling apparatus 100 on the wafer carrier 10, the automated wafer carrier handling apparatus 100 is driven by the transport means to perform a linear motion along the direction indicated by the arrow AR2. For example, the automated wafer carrier handling apparatus 100 is moved upwardly in the vertical direction. With reference to FIG. 1D, the base frame 110 of the automated wafer carrier handling apparatus 100 is lifted until the second parts 114b of the support members 114 are brought into abutting contact with the first portion 22 of the top flange 20. For example, the top flange 20 mounted on the wafer carrier 10 is leaned against the support members 114 of the base frame 110 for limitation of freedom of movement in the vertical direction (i.e. Z direction). It should be noted that for ease of description, and without intending the structures disclosed herein to be limited to any particular orientation, a direction perpendicular to planes of the receiving surface RPs of the receiving place RP will be referred to herein for convenience as a "vertical direction".

Referring to FIG. 6D with reference to FIGS. 1D and 2A, after the wafer carrier 10 is in position and the support members 114 of the base frame 110 is abutted against the top flange 20, the active expansion component 122 of the engaging mechanism 120 controlled by the controller 124 is moved in the direction indicated by the arrow AR3 to be engaged with the top flange 20. The directions indicated by the arrows AR2 and AR3 may be opposite to each other. For example, during the movement of lowering down the active expansion component 122, the controller 124 applies a force upon the stabilizer 126 to make the active expansion component 122 move downwardly, so that the rod portion 122a and the engaging portion 122b of the active expansion component 122 driven by the controller 124 via the stabilizer 126 are pressed down with respect to the base plate 112. In some embodiments, when the engaging portion 122b is moved downwardly out of the recess 112r of the base plate 112, the expanding parts 122bd are deployed outwardly as shown in FIG. 2A. With continuing the motion of lowering the active expansion component 122, the expanding parts 122bd of the engaging portion 122b may be plugged into the hole 20a of the top flange 20.

In some embodiments, the expanding parts 122bd of the engaging portion 122b and the hole 20a of the top flange 20 are complimentary in shape. For example, the expanding parts 122bd in the expanded state are tapered from the top to the bottom relative to the receiving surface RPs of the receiving place RP, and the profile of the hole 20a is also tapered from top to the bottom relative to the receiving surface RPs of the receiving place RP. The hole 20a of the top flange 20 may be or may not be completely plugged by the engaging portion 122b of the active expansion component 122. In some embodiments, the deeper the engagement, the greater the engagement force. In some embodiments, the expanding parts 122bd are abutted against the inner sidewall of the top flange 20, which defines the hole 20a, with the elastic force. For example, the expanding parts 122bd of the engaging portion 122b coupled to the extending parts 122bc are elastically movable via the elastic member 122bm, thereby allowing the expanding parts 122bd to be engaged with the inner sidewall of the top flange 20 in the hole 20a. In other embodiments in which the hole 20a is a threaded hole, the expanding parts 122bd are engaged with the top flange 20 in a threaded manner. It should be appreciated that other suitable engaging manner may be employed as long as the engaging mechanism 120 may be stably engaged with the top flange 20 during transportation.

In some embodiments, once the expanding parts 122bd are firmly inserted into the hole 20a of the top flange 20, the wafer carrier 10 may be transferred by the automated wafer carrier handling apparatus 100 without swinging, and then the wafer carrier 10 may be transported to the destination location. In some embodiments, the engaging portion 122b of the active expansion component 122 is engaged with the hole 20a of the top flange 20 mounted on the wafer carrier 10 to limit the freedom of movement of the wafer carrier 10 in both of the X and Y directions. The automated wafer carrier handling apparatus 100 is configured to control the displacement of the wafer carrier 10 via limiting multiple degrees of freedom of movement of the top flange 20 on the wafer carrier 10 to ensure stability during transporting the wafer carrier 10 from the originating location to the destination location.

In some embodiments, the operations of abutting the support members 114 of the base frame 110 against the top flange 20, plugging the engaging portion 122b of the active expansion component 122 into the hole 20a of the top flange 20, and lifting the top flange 20 are sequentially performed. In some embodiments, the operations of abutting the support members 114 of the base frame 110 against the top flange 20 and plugging the engaging portion 122b into the hole 20a of the top flange 20 are performed during the same step. The operation of plugging the engaging portion 122b of the active expansion component 122 into the hole 20a of the top flange 20 may be performed prior to the operation of abutting the support members 114 of the base frame 110 against the top flange 20. Alternatively, the operation of plugging the engaging portion 122b of the active expansion component 122 into the hole 20a of the top flange 20 may be performed after abutting the support members 114 against the top flange 20. In some other embodiments, after plugging the engaging portion 122b of the active expansion component 122 into the hole 20a of the top flange 20, the operations of abutting the support members 114 of the base frame 110 against the top flange 20 and lifting the top flange 20 are performed simultaneously.

Figure 6E:
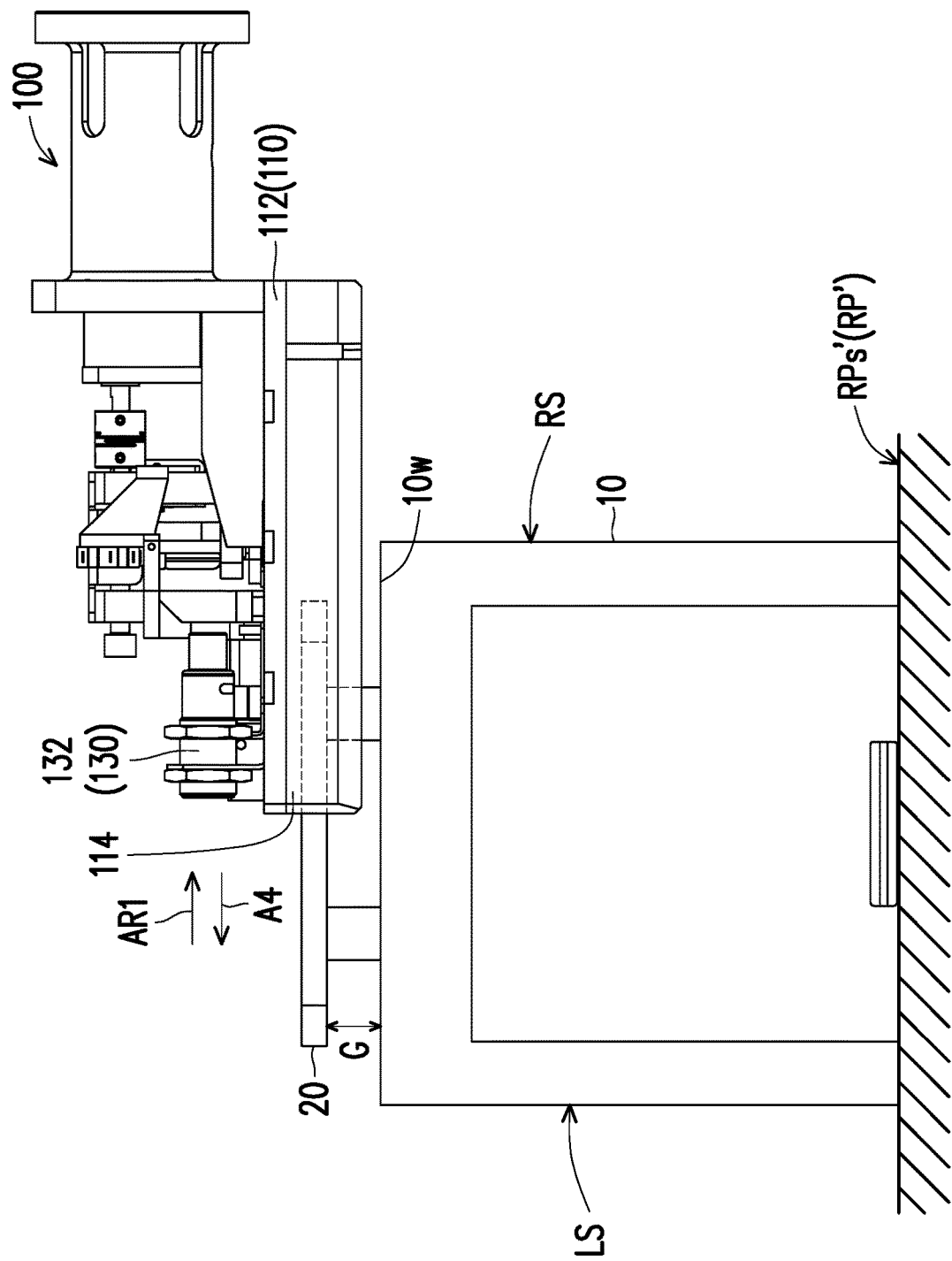

Referring to FIG. 6E, when arriving the destination location, the wafer carrier 10 is loaded on the receiving surface RPs' of the receiving place RP'. In some embodiments, the receiving place RP' is viewed as the destination location. A reverse sequence of operations may be performed to release the automated wafer carrier handling apparatus 100 from the top flange 20 to unload the wafer carrier 10. For example, with reference to FIGS. 3A-3B, the stabilizer 126 is removed from the top of the rod portion 122a. Since the pressing force applied to the rod portion 122a is removed, the active expansion component 122 may be moved upwardly due to the restoration force. For example, the elastic member 122bm offers the elastic force that enables the expanding parts 122bd of the engaging portion 122b moving back in the contracted state. For example, the expanding parts 122bd of the engaging portion 122b are retracted from the hole 20a of the top flange 20 and then accommodated in the recess 112r of the base plate 112.

After loading the wafer carrier 10 on the receiving surface RPs' of the receiving place RP', the automated wafer carrier handling apparatus 100 controlled by the transport means may be moved downwardly. When lowering the automated wafer carrier handling apparatus 100, the support members 114 of the base frame 110 are no longer in physical contact with the top flange 20, so that the top flange 20 is released from the support members 114. For example, the second parts 114b of the support members 114 are not in abutting contact with the first portion 22 of the top flange 20 and may be suspended in the gap G without contacting the top flange 20 and the wafer carrier 10 (e.g., as shown in FIG. 6B). In some embodiments, the operations of retracting the engaging portion 122b from the hole 20a of the top flange 20 and lowering down the automated wafer carrier handling apparatus 100 are sequentially performed. In other embodiments, the operation of lowering down the automated wafer carrier handling apparatus 100 is performed before the operation of reverting the engaging portion 122b from the hole 20a of the top flange 20. Alternatively, after loading the wafer carrier 10 on the receiving surface RPs' of the receiving place RP', the operations of reverting the engaging portion 122b from the hole 20a of the top flange 20 and lowering down the automated wafer carrier handling apparatus 100 are performed simultaneously.

After releasing the engaging portion 122b of the active expansion component 122 and the support members 114 of the base frame 110 from the top flange 20, the automated wafer carrier handling apparatus 100 may be moved away from the wafer carrier 10 along the direction from the left side LS to the right side as indicated by the arrow AR1. In some embodiments, after loading the wafer carrier 10, the automated wafer carrier handling apparatus 100 is driven to slide from the right side RS to the left side LS as indicated by the arrow AR4.

It is noted that although the operating method shown in FIGS. 6A-6D starts from moving the automated wafer carrier handling apparatus 100 along the direction as indicated by the arrow AR1, in other embodiments, the operating method may start from moving the automated wafer carrier handling apparatus 100 into the gap G along the direction indicated by the arrow AR4. The automated wafer carrier handling apparatus 100 may be driven to slide out of the gap G along the direction indicated by either the arrow AR1 or the arrow AR4. For example, the direction indicated by the arrow AR1 (or AR4) is substantially parallel to the short sides 10w of the wafer carrier 10. It is also noted that the illustration of a single automated wafer carrier handling apparatus 100 is merely an example, and multiple automated wafer carrier handling apparatus may be connected to the transport means for transporting multiple wafer carriers at the same time for improving productivity.

FIG. 7A to FIG. 7E are schematic views illustrating an automated wafer carrier handling apparatus at various stages of performing an operation method according to some embodiments of the present disclosure, and FIG. 7F is a schematic perspective view illustrating an automated wafer carrier handling apparatus carrying a wafer carrier according to some embodiments of the present disclosure. FIGS. 7A-7F shows that the automated wafer carrier handling apparatus 100 is configured to lift the top flange 20 along the long sides of the wafer carrier 10. The operating method of the automated wafer carrier handling system may be similar to the operating method described above, so the detailed descriptions may be simplified for the sake of brevity. While the operation method is illustrated and described below as a series of acts or events, it will be appreciated that the illustrated ordering of such acts or events are not to be interpreted in a limiting sense.

Figure 7B:
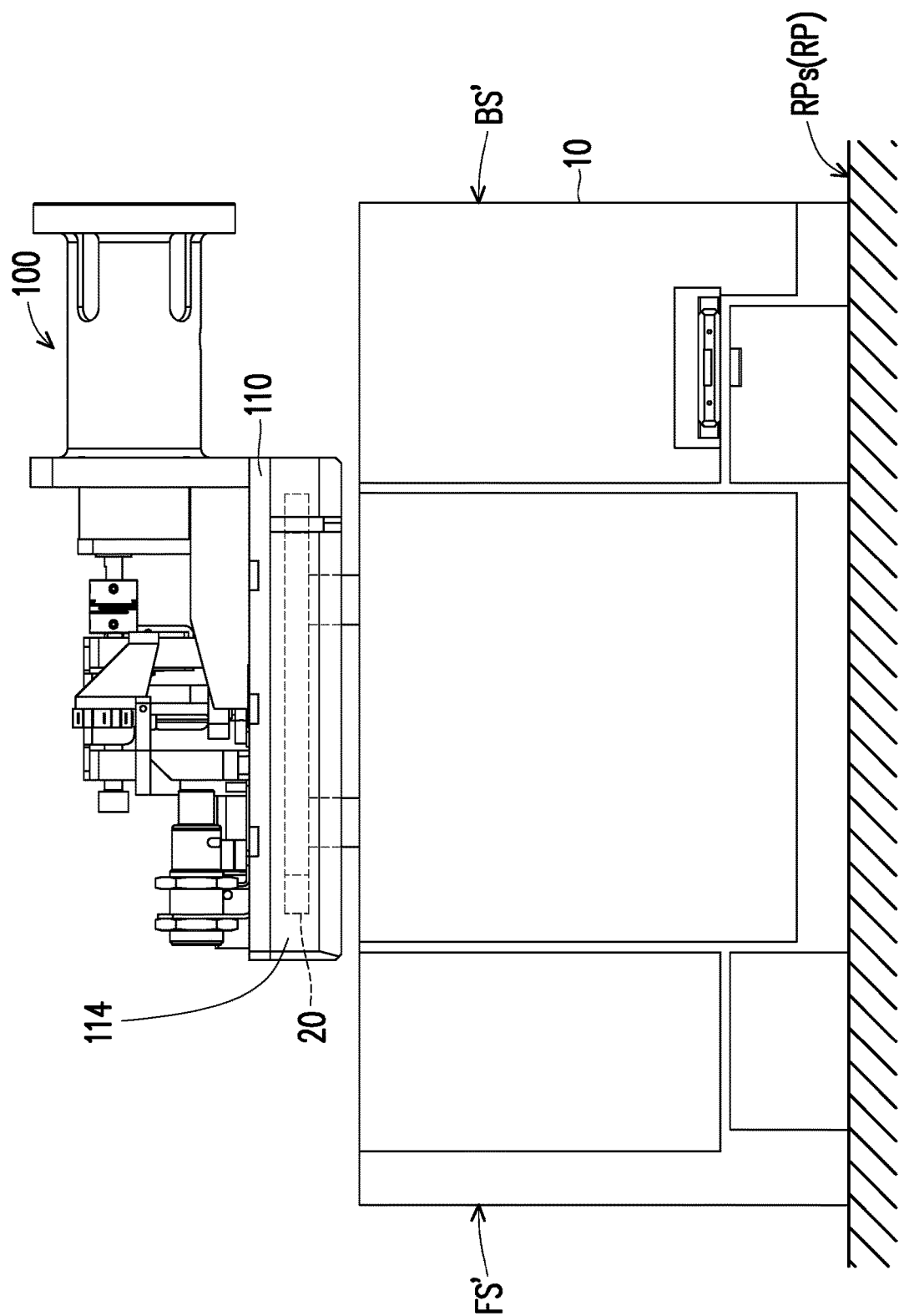
Figure 7C:
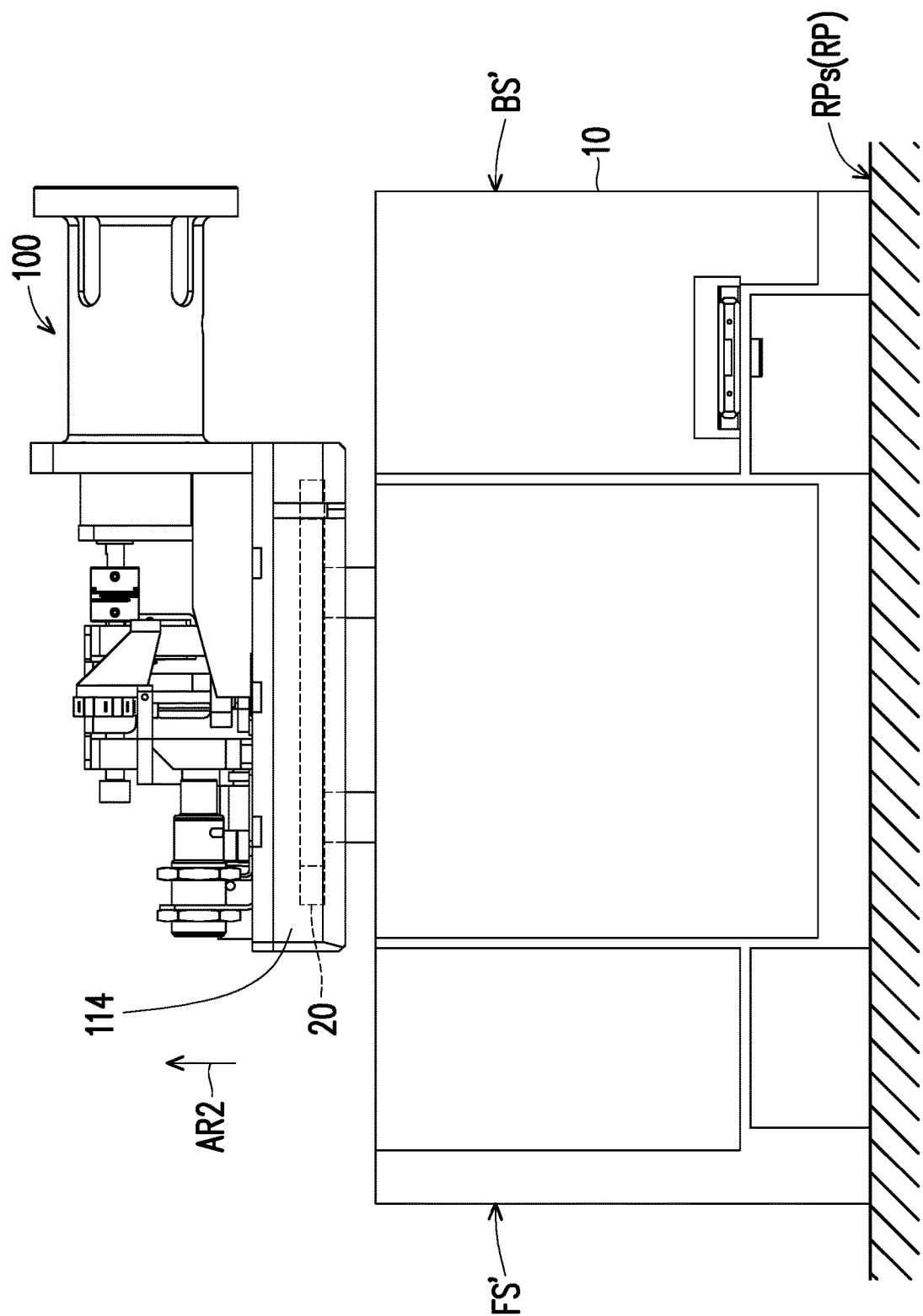
Figure 7E:
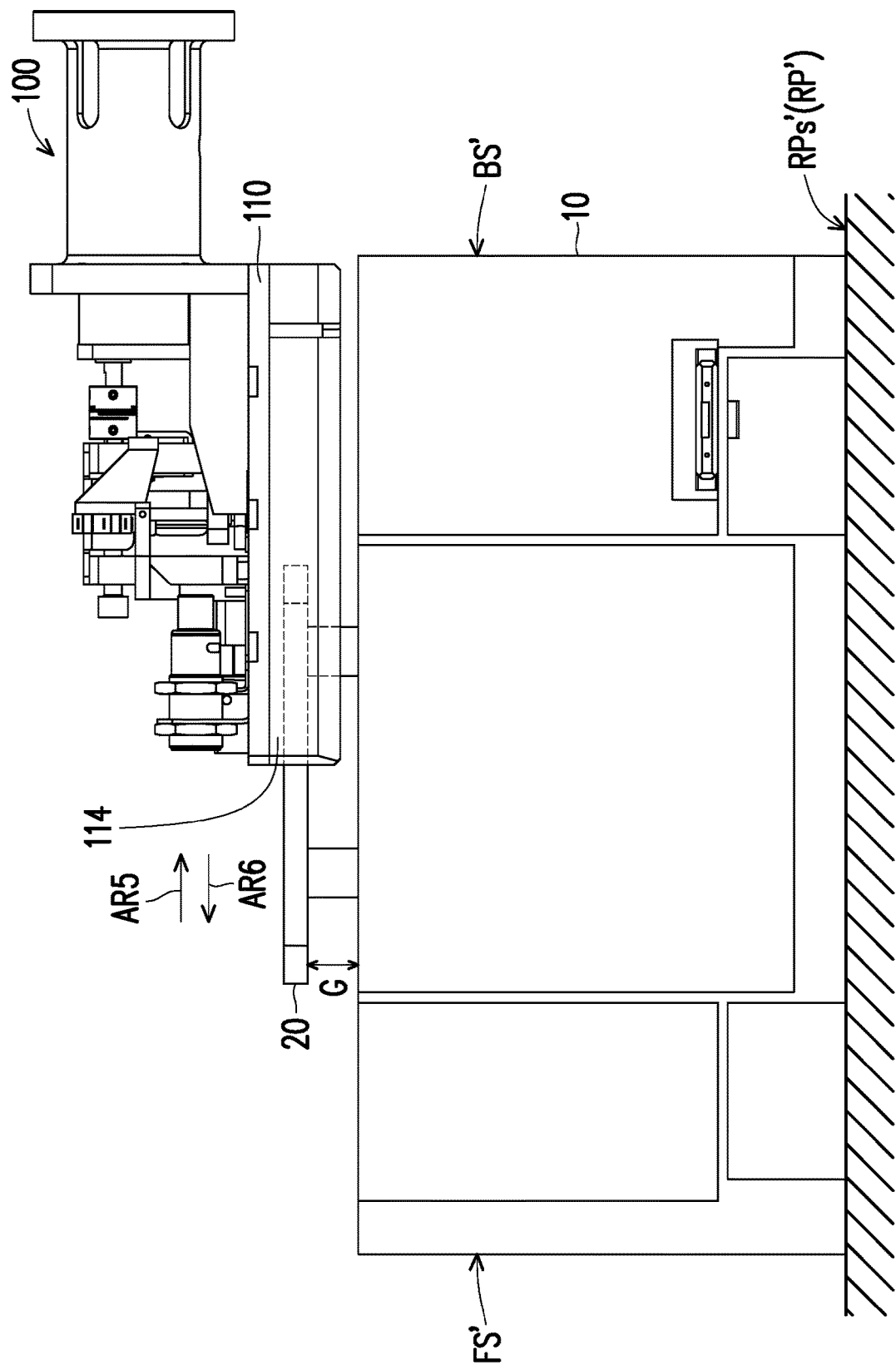
Figure 7F:
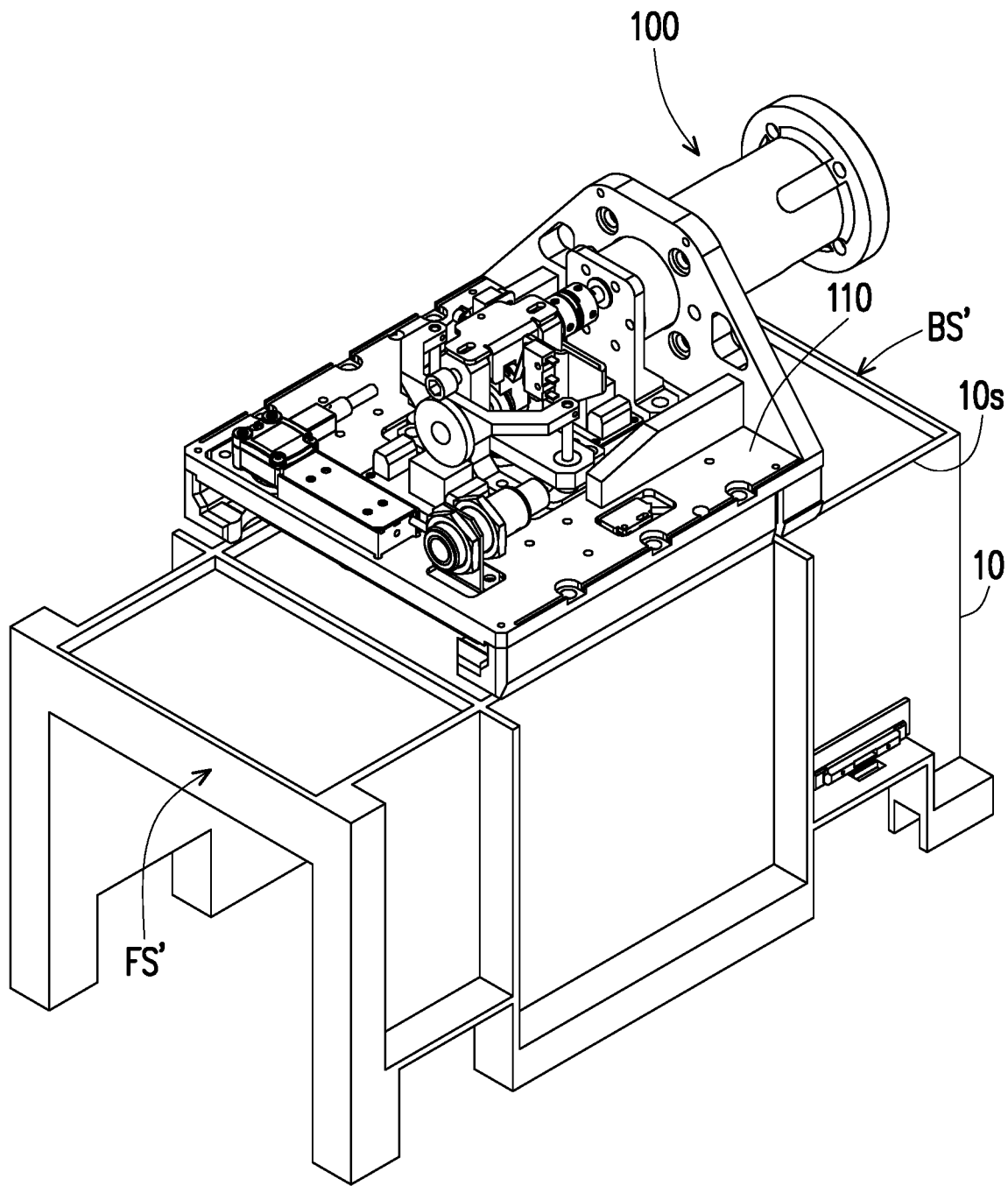
FIG. 7F is a schematic perspective view illustrating an automated wafer carrier handling apparatus carrying a wafer carrier according to some embodiments of the present disclosure.

Referring to FIGS. 7A-7B and 7F, the automated wafer carrier handling apparatus 100 may be positioned at the front side FS' of the wafer carrier 10 and then moved into the gap G along the direction indicated by the arrow AR5. For example, the moving direction of the automated wafer carrier handling apparatus 100 is substantially parallel to the long sides 10s of the wafer carrier 10. For example, the automated wafer carrier handling apparatus 100 slides along the horizontal direction from the front side FS' of the wafer carrier 10 to the back side BS' of the wafer carrier 10 until the base frame 110 is positioned above the top flange 20. In some embodiments, the active expansion component is aligned with the hole of the top flange 20. As shown in FIG. 7B, at this stage, the base frame 110 of the automated wafer carrier handling apparatus 100 may not be in physical contact with the top flange 20 and the wafer carrier 10.

Referring to FIG. 7C, after positioning the automated wafer carrier handling apparatus 100 above the top flange 20, the automated wafer carrier handling apparatus 100 is moved along the direction indicated by the arrow AR2. For example, the automated wafer carrier handling apparatus 100 is lifted until the support members 114 are brought into abutting contact with the top flange 20. The top flange 20 mounted on the wafer carrier 10 may be leaned against the support members 114 for limitation of freedom of movement in the vertical direction.

Referring to FIG. 7D, the engaging mechanism 120 is moved along the direction indicated by the arrow AR3 to be engaged with the top flange 20. With reference to FIG. 1D, for example, during the movement of lowering down the active expansion component 122, the stabilizer 126 is rotated to press the active expansion component 122 down relative to the base plate 112, so that the engaging portion 122b of the active expansion component 122 is moved out of the recess 112r of the base plate 112 and to be deployed in the expanded state, and then the expanding parts 122bd of the engaging portion 122b may be plugged into the hole 20a of the top flange 20. In some embodiments, the active expansion component 122 is plugged into the top flange 20 after abutting the support members 114 against the top flange 20. In other embodiments, the operation steps illustrated in FIGS. 7C-7D may be performed simultaneously in the same step. After the active expansion component 122 is firmly inserted into the hole 20a of the top flange 20, the wafer carrier 10 may be lifted and transported to the destination location via the automated wafer carrier handling apparatus 100.

Referring to FIG. 7E, the wafer carrier 10 may be loaded on the receiving surface RPs' of the receiving place RP' via the automated wafer carrier handling apparatus 100. After loading the wafer carrier 10, the top flange 20 on the wafer carrier 10 may be released from the automated wafer carrier handling apparatus 100, and then the automated wafer carrier handling apparatus 100 is moved away from the wafer carrier 10 for next round. For example, after the wafer carrier 10 is disposed on the receiving surface RPs' of the receiving place RP', the engaging mechanism 120 is retracted from the hole of the top flange 20 and the base frame 110 is slightly lowered down so that the automated wafer carrier handling apparatus 100 is no longer in abutting contact with the top flange 20. Subsequently, the automated wafer carrier handling apparatus 100 is moved away from the wafer carrier 10 along the direction indicated by the arrow AR5. In other embodiments, the automated wafer carrier handling apparatus 100 is driven to slide out of the gap G from the back side BS' to the front side BS' along the direction indicated by the arrow AR6. In some embodiments, the operating step starts from moving the automated wafer carrier handling apparatus 100 along the direction indicated by the arrow AR6 to slide into the gap G at the originating location in order to transporting the wafer carrier 10 to the destination location. The automated wafer carrier handling apparatus 100 may be moved into/out of the gap G from any orientation (e.g., from the front side FS', the back side BS', the right side RS, or the left side LS) of the wafer carrier 10, thereby improving the efficiency and the flexibility of the automated wafer carrier handling apparatus 100.

Figure 8:
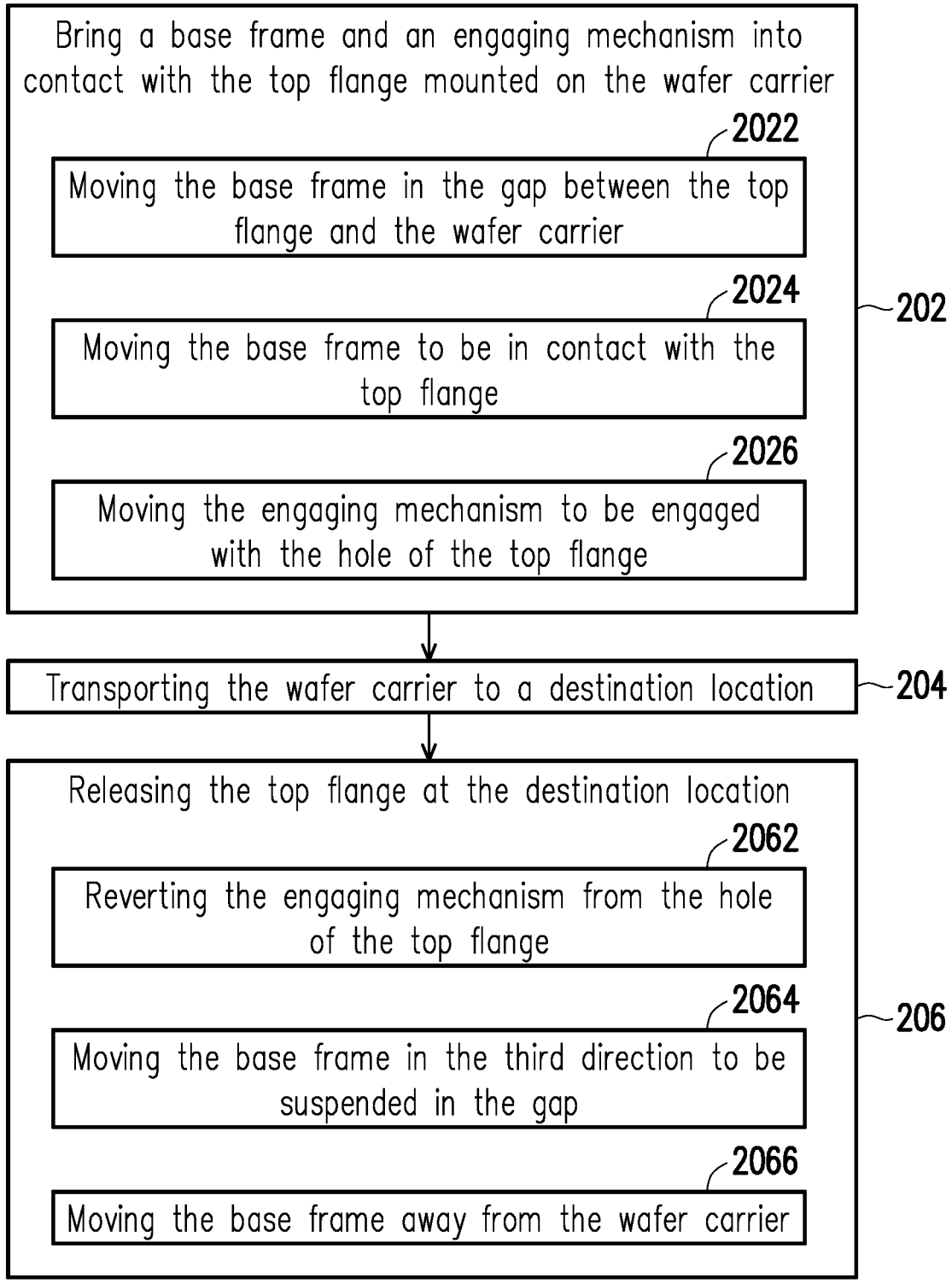
FIG. 8 is a flow diagram illustrating an operating method of an automated wafer carrier handling apparatus according to some embodiments of the present disclosure.

FIG. 8 is a flow diagram illustrating an operating method of an automated wafer carrier handling apparatus according to some embodiments of the present disclosure. An operating method may be employed to transport the target wafer carrier from an originating location to a destination location among stations in the FAB without having to wait for the operator to load/unload the wafer carriers. It is noted that an operating method including the following operations is merely an example, and construes no limitation in the disclosure. While an operating method is illustrated and described below as a series of acts or operations, it should be understood that additional operation(s) may be provided before, during, and after the operating method, certain operation(s) may be performed concurrently with other operations, and certain operation(s) may be omitted.

At the operation 202, a base frame and an engaging mechanism of the automated wafer carrier handling apparatus are brought into abutting contact with the top flange mounted on the wafer carrier to limit degrees of freedom of movement of the top flange, where the engaging mechanism is disposed on the base frame. For example, the operation 202 includes the following actions.

At the action 2022, the base frame of the automated wafer carrier handling apparatus is moved in the gap between the top flange and the wafer carrier in a first direction (e.g., one of directions indicated by the arrows (AR1/AR4 shown in FIG. 6E or AR5/AR6 shown in FIG. 7E), and FIGS. 6A-6B or FIGS. 7A-7B illustrate the views corresponding to the action.

At the action 2024, the base frame of the automated wafer carrier handling apparatus is moved in a second direction (e.g., the direction indicated by the arrow AR2 shown in FIG. 6C or FIG. 7C) to be in contact with the top flange, where the second direction is perpendicular to the first direction, and FIG. 6C or FIG. 7C illustrates the front view corresponding to the action.

At the action 2026, the engaging mechanism of the automated wafer carrier handling apparatus may be moved in a third direction (e.g., the direction indicated by the arrow AR3 shown in FIG. 6D or FIG. 7D) to be engaged with the hole of the top flange, where the third direction is opposite to the second direction, and FIG. 6D or FIG. 7D illustrates the front view corresponding to the action. In some embodiments, the actions 2024 and 2026 may be performed at a same time, and not one before the other, At the operation 204, the wafer carrier is transported by the automated wafer carrier handling apparatus from an originating location to a destination location. For example, the wafer carrier is lifted after bring the automated wafer carrier handling apparatus into abutting contact with the top flange, and then the wafer carrier is transported to a destination location. When the automated wafer carrier handling apparatus carrying the wafer carrier arrives at the destination location, the wafer carrier is loaded on the predetermined position. FIG. 6E or FIG. 7E illustrates the view corresponding to the step of loading the wafer carrier on the receiving place at the destination location.

At the operation 206, the top flange mounted on the wafer carrier is released from the automated wafer carrier handling apparatus at the destination location. For example, the operation 206 includes the following actions.

At the action 2062, the engaging mechanism is reverted in the second direction from the hole of the top flange. At the action 2064, the base frame of the automated wafer carrier handling apparatus is moved along the third direction to be suspended in the gap between the top flange and the wafer carrier. In some embodiments, the actions 2062 and 2064 may be performed at a same time, and not one before the other. At the action 2066, the base frame of the automated wafer carrier handling apparatus is moved away from the wafer carrier. FIG. 6E or FIG. 7E illustrates the view corresponding to the step of moving the automated wafer carrier handling apparatus away from the wafer carrier.

According to some embodiments, an apparatus for automated wafer carrier handling which is adapted to transport a wafer carrier is provided. The apparatus includes a base frame and an engaging mechanism disposed on the base frame. The engaging mechanism includes a controller and an active expansion component moveably coupled to the base frame and controlled by the controller to perform a reciprocating movement relative to the base frame. The active expansion component is driven by the controller to pass through the base frame to be engaged with a top flange mounted on the wafer carrier.

According to some alternative embodiments, an operation method for automated wafer carrier handling includes at least the following steps. A base frame and an engaging mechanism of an automated wafer carrier handling apparatus are brought into abutting contact with a top flange mounted on a wafer carrier to limit at least one degree of freedom of movement of the top flange, where the engaging mechanism is disposed on the base frame. The wafer carrier is transported to a destination location by the automated wafer carrier handling apparatus. The top flange mounted on the wafer carrier is released from the automated wafer carrier handling apparatus at the destination location.

According to some alternative embodiments, an operation method for automated wafer carrier handling includes at least the following steps. A base frame of an apparatus is moved in a gap between a top flange and a wafer carrier to be in contact with the top flange, wherein the top flange is mounted on the wafer carrier. An active expansion component of the apparatus is lowered to be engaged with a hole of the top flange, wherein the active expansion component is disposed on the base frame. The top flange mounted on the wafer carrier is moved via the apparatus to transport the wafer carrier.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An apparatus for automated wafer carrier handling, the apparatus adapted to transport a wafer carrier, the apparatus comprising:

a base frame; and an engaging mechanism disposed on the base frame and comprising:

a controller; and an active expansion component moveably coupled to the base frame and controlled by the controller to perform a reciprocating movement relative to the base frame, wherein the active expansion component is driven by the controller to pass through the base frame to be engaged with a top flange mounted on the wafer carrier.

2. The apparatus for automated wafer carrier handling of claim 1, wherein the active expansion component comprises:

an engaging portion adapted to be accommodated in a recess of the base frame in a contracted state and deployed in an expanded state to insert into a hole of the top flange.

3. The apparatus for automated wafer carrier handling of claim 2, wherein the active expansion component comprises an elastic member allowing the engaging portion to be elastically movable.

4. The apparatus for automated wafer carrier handling of claim 1, wherein the base frame comprises:
a base plate; and
a pair of support members connected to the base plate, each of the pair of support members comprising a part spacing a vertical distance from the base plate, and the top flange is adapted to be abutted against the parts of the pair of support members.

5. The apparatus for automated wafer carrier handling of claim 4, wherein a vertical distance between the parts of the pair of support members and the base plate is substantially greater than a thickness of the top flange mounted on the wafer carrier.

6. The apparatus for automated wafer carrier handling of claim 4, wherein at least one degree of freedom of movement of the top flange mounted on the wafer carrier is limited by the pair of support members abutting against the top flange.

7. The apparatus for automated wafer carrier handling of claim 1, further comprising:
a sensor disposed on the base frame and adapted to perform at least one of the following functions: detecting a distance between the automated wafer carrier handling apparatus and a surrounding object to avoid collision, detecting the presence or absence of the wafer carrier, and detecting a placement status of the wafer carrier.

8. The apparatus for automated wafer carrier handling of claim 1, further comprising:
an image alignment system disposed on the base frame and comprising a light source and an optical detection device optically coupled to the light source for identifying and positioning the wafer carrier.

9. The apparatus for automated wafer carrier handling of claim 4, wherein each of the pair of support members comprises an L-shaped bracket.

10. The apparatus for automated wafer carrier handling of claim 9, wherein a first part of the L-shaped bracket extends along a sidewall of the base plate, and a second part of the L-shaped bracket is connected to the first part and extends parallel to a bottom surface of the base plate.

11. The apparatus for automated wafer carrier handling of claim 1, wherein the engaging mechanism further comprises:
a stabilizer disposed on and operably abutted against the active expansion component.

12. The apparatus for automated wafer carrier handling of claim 11, wherein the controller of the engaging mechanism issues control signals to operate motions of the stabilizer.

13. The apparatus for automated wafer carrier handling of claim 1, wherein the active expansion component comprises a rod portion and an engaging portion connected to the rod portion, and the rod portion penetrates through a base plate of the base frame.

14. The apparatus for automated wafer carrier handling of claim 13, wherein the rod portion of the active expansion component has a side connected to the engaging portion and an opposing side abutted against a stabilizer of the engaging mechanism.

15. The apparatus for automated wafer carrier handling of claim 14, wherein the stabilizer is driven by the controller to press down the rod portion of the active expansion component.

16. The apparatus for automated wafer carrier handling of claim 14, wherein the stabilizer comprises a strip portion and a wheel portion coupled to the strip portion, and the strip portion is pivotably coupled to the controller.

17. The apparatus for automated wafer carrier handling of claim 13, wherein expanding parts of the engaging portion of the active expansion component are deployed by a non-zero distance to be engaged with the top flange mounted on the wafer carrier.

18. The apparatus for automated wafer carrier handling of claim 17, wherein the non-zero distance is limited by extending parts of the active expansion component, and each of the expanding parts is connected to one of the extending parts.

19. The apparatus for automated wafer carrier handling of claim 18, wherein an elastic member is sleeved on the rod portion to drive the extending parts.

20. The apparatus for automated wafer carrier handling of claim 17, wherein each of the expanding parts of the engaging portion of the active expansion component comprises a bottom surface, a top surface wider than the bottom surface, and an inclined sidewall connected to the top surface and the bottom surface.

* * * * *